United States Patent
Servi et al.

(10) Patent No.: US 7,032,166 B2
(45) Date of Patent: Apr. 18, 2006

(54) METHOD AND APPARATUS FOR PROTECTING DATA

(75) Inventors: Leslie David Servi, Lincoln, MA (US); Eushiuan T. Tsung, Needham, MA (US); Joseph Anthony Cooley, Burlington, MA (US); Jeremy Mineweaser, Marina Del Ray, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 494 days.

(21) Appl. No.: 10/308,627

(22) Filed: Dec. 3, 2002

(65) Prior Publication Data

US 2004/0107400 A1 Jun. 3, 2004

(51) Int. Cl.
*G06F 11/00* (2006.01)
*H04L 1/00* (2006.01)

(52) U.S. Cl. .................................. 714/800
(58) Field of Classification Search ............ 714/752, 714/753, 755, 758, 780, 784, 800
See application file for complete search history.

(56) References Cited

U.S. PATENT DOCUMENTS 4,295,218 A * 10/1981 Tanner ................. 714/762
6,633,856 B1 * 10/2003 Richardson et al. ......... 706/15

FOREIGN PATENT DOCUMENTS

WO WO 00/18017 3/2000

* cited by examiner

*Primary Examiner*—Guy Lamarre
*Assistant Examiner*—James C. Kerveros
(74) *Attorney, Agent, or Firm*—Wolf, Greenfield & Sacks, P.C.

(57) ABSTRACT

In one aspect, a technique is provided for protecting a data set with a parity set defined by a bipartite graph having a degree distribution that includes no parity symbol having a degree less than three. In another aspect, a parity set defined by an irregular bipartite graph is transmitted along with the data set, and corruptions in the data set are decoded using the data set and the parity set. In another aspect, a particularly useful degree distribution for the parity symbols is defined.

53 Claims, 11 Drawing Sheets

| Device | # of Parity Points |
|---|---|
| 1 | 0 |
| 2 | 0 |
| 3 | 3 |
| 4 | 1 |
| 5 | 1 |
| 6 | 0 |
| 7 | 0 |
| 8 | 1 |

$$x = \left(\frac{pk}{j} - \frac{pk+1-A\sqrt{pk}}{j+1}\right)$$

$$602 \underbrace{\sum_{j=1}^{i\max} N_j}_{} = int\left[s\underbrace{\sum_{j=1}^{i\max}(x)}_{601}\right] \longleftarrow 600$$

$j=1, x=1.5$
$j=2, x=0.2$
$j=3, x=0.2$
$j=4, x=0.2$
$j=5, x=0.2$

Step 601 ⟶ $N_1 = \text{Int}[1.5]$ ⟶ 1

Step 603 ⟶ $N_1 + N_2 = \text{Int}[1.5+.2]$ ⟶ 1+0

Step 605 ⟶ $N_1 + N_2 + N_3 = \text{Int}[1.5+.2+.2]$ ⟶ 1+0+0

Step 607 ⟶ $N_1 + N_2 + N_3 + N_4 = \text{Int}[1.5+.2+.2+.2]$ ⟶ 1+0+0+1

Step 609 ⟶ $N_1 + N_2 + N_3 + N_4 + N_5 = \text{Int}[1.5+.2+.2+.2+.2]$ ⟶ 1+0+0+1+0

FIG. 6

METHOD AND APPARATUS FOR PROTECTING DATA

STATEMENT OF GOVERNMENT INTEREST

The Government of the United States of America may have rights in this invention pursuant to contract #F19628-00-C-0002, awarded by the United States Air Force.

FIELD OF THE INVENTION

The present invention relates to error correction and erasure correction codes, and more particularly to those based on a bipartite graph.

DESCRIPTION OF THE RELATED ART

In an ideal system, any data received over a communications channel would exactly match the data that was transmitted over the channel. Likewise, any data that is retrieved from storage would exactly match the data that was stored. However, in actual systems errors and/or data loss occur, and may be caused by, for example, noise on a communications channel, corruptions on a storage medium, or a hardware failure. In many situations, data cannot be retransmitted. For example, in a communication system using a one-way channel, the receiving node cannot ask the transmitting node to retransmit data if an error in the data is detected. Similarly, in a storage system it is too late to ask for retransmission after the data has been stored for a long period of time and errors are only detected when the data is retrieved from the storage system.

Two types of data corruption to be protected against are erasures and errors. An erasure occurs when a portion of the original data is missing from the received data, but the location of the missing data is known. An error occurs when a portion of the data is altered (e.g., one or more bits are flipped), although the location of the erroneous bits may be unknown. In the present application, the term corruption is used to refer to erasures and/or errors.

To protect against errors or erasures in a data set, extra information may be added to the data set to be used later to correct the data set if it is corrupted. This extra information is often referred to as parity bits. Many codes have been developed to correct erasures and errors in data by providing parity which corresponds to the data.

One known code that supports both erasure and error correction is the Reed-Solomon code. In Reed-Solomon, when protecting the data set against erasure corruptions, the number of parity bits is equal to the total number of bits in the data set to be protected against corruption at any one time. For example, if the user seeks to protect a data set against a loss of any four bits, precisely four bits are computed according to the Reed-Solomon code to fully protect the data set. When protecting the data set against error corruptions, the total number of parity bits is equal to twice the total number of data bits in the data set to be protected against corruption at any one time. As the size of the data set to be protected increases linearly, the computational cost of the Reed-Solomon algorithm increases exponentially, even if the specified number of bits that may be corrupted (and consequently the number of parity bits) remains constant. Thus, Reed-Solomon is often impractical for protecting large blocks of data. A version of the Reed-Solomon code referred to as concatenated Reed-Solomon, divides the data set to be protected into multiple smaller data blocks to reduce the computational complexity for each of these smaller blocks. However, the user cannot then select a quantity of loss to be protected against for the overall data set, but must do so on a block-by-block level. Selection on a block-by-block level can require a large number of parity bits to protect against the possibility that a number of bits may be corrupted that, although small when compared against the entire data set, is quite large when compared against the size of each block.

Another code, known as the Luby Transform, uses an irregular bipartite graph to generate a code for a data set. A bipartite graph is a graph which includes two sets of vertices or points, with each point in the first set being connected to at least one point in the second set by an edge of the graph, and with each edge in the graph connecting a point in the first set with a point in the second set. That is, there are no edges in the graph which connect two points in the same set. With the Luby Transform, the first set of points is used to represent the data set and the second set of points is used to represent the parity information. Each point in the first set represents one or more bits from the data set. Each point in the second set represents a parity bit that is the exclusive-OR (XOR) of the data bits represented by the points in the first set to which it is connected. The number of edges of the graph connected to a point establishes what is known as a degree for the point.

The Luby Transform generates an indefinite number of parity bits which are transmitted as a stream without any data bits. The receiver processes the parity bits until enough are received to reconstruct the entire data set. Although the Luby Transform is computationally less complex than the Reed-Solomon algorithm, the Luby Transform is less spatially efficient. That is, more parity information must be generated because the entire data set is reconstructed each time the data set is decoded.

SUMMARY OF THE INVENTION

One embodiment of the invention is directed to a method comprising an act of protecting a data set that comprises a plurality of data bits with a parity set that comprises a plurality of parity bits, wherein the parity set and the data set have a relationship defined by a bipartite graph comprising a plurality of data points and a plurality of parity points, wherein each data point represents at least one of the plurality of data bits and each parity points represents at least one of the plurality of parity bits, wherein each one of the plurality of parity points has a degree that defines a number of data points to which the one of the plurality of parity points corresponds, the plurality of parity points being selected to have a first degree distribution that is substantially similar to a second degree distribution in which $N_j$ defines a number of parity points of degree j, wherein $N_j$ is equal to zero for values of j from 1 through j* plus 1, and wherein $N_j$ satisfies the following formula for values of j from j* plus 2 to imax:

$$\sum_{j=j^*+2}^{imax} N_j = \text{Int}\left[s \sum_{j=j^*+2}^{imax} \left(\frac{pk}{j-j^*-1} - \frac{pk+1-A\sqrt{pk}}{j-j^*}\right)\right]$$

wherein;
  p is a fraction of loss being protected against;
  k is a number of data symbols in the bipartite graph;
  imax defines a maximum possible degree for the parity symbols in the bipartite graph;

s is a scaling factor;

j* defines a degree of a lowest non-zero degree parity symbol minus two; and

A is a variable.

Other embodiments are directed to at least one computer readable medium encoded with instructions that, when executed, perform the above-described method, and an apparatus comprising at least one of an encoder and a decoder that implements the above-described method.

A further embodiment is directed to a method comprising an act of protecting a data set that comprises a plurality of data bits with a parity set that comprises a plurality of parity bits, wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a degree distribution that includes no parity point having a degree less than three. Other embodiments are directed to at least one computer readable medium encoded with instructions that, when executed, perform the above-described method, and an apparatus comprising at least one of an encoder and a decoder that implements this method.

Another embodiment of the invention is directed to a method comprising at least one of creating a protection scheme for a data set and decoding at least a portion of the data set using the protection scheme. Creating the protection scheme comprises acts of encoding a parity set that has a relationship with the data set defined by an irregular bipartite graph and transmitting the parity set and the data set to a receiver. Decoding the at least a portion of the data set comprises acts of receiving the data set and a parity set that has a relationship with the data set defined by an irregular bipartite graph and decoding the at least a portion of the data set using the data set and a parity set. A further embodiment is directed to at least one computer readable medium encoded with instructions that, when executed, perform this method.

A further embodiment is directed to an apparatus comprising at least one of an encoder to encode a parity set for a data set and a decoder to decode at least a portion of the data set using the parity set. The encoder encodes a parity set that has a relationship with the data set defined by an irregular bipartite graph and transmits the parity set to a receiver along with the data set. The decoder receives the data set and a parity set having a relationship with the data set defined by an irregular bipartite graph and decodes the at least a portion of the data set using the data set and the parity set.

A further embodiment is directed to a method of recovering from a corruption of at least a portion of a data set. The method comprises acts of: (A) decoding the at least a portion of the data set using a parity set that comprises a plurality of parity bits and that has a relationship with the data set defined by a bipartite graph; and (B) storing information identifying actions taken during the act (A) of decoding. Other embodiments are directed to at least one computer readable medium and an apparatus that implement this method.

A further embodiment is directed to a method of recovering from a corruption of at least a portion of a data set having a plurality of data bits, the data set being protected by a parity set that comprises a plurality of parity bits, wherein the parity set and the data set have a relationship defined by a bipartite graph. The method comprises acts of: (A) creating at least one first data structure that is indexed by the data bits and that identifies which parity bits correspond thereto; (B) creating at least one second data structure that is indexed by the parity bits and that identifies which data bits correspond thereto; and (C) decoding the at least a portion of the data set using at least one of the first and second data structures. Other embodiments are directed to at least one computer readable medium and an apparatus that implement this method.

Another embodiment is directed to a method of determining whether a bipartite graph defines parity sets that are suitable to protect corresponding data sets against a first quantity of corruption within a first failure rate. The method comprises acts of: (A) selecting a second quantity of corruption that exceeds the first quantity of corruption; (B) selecting a second failure rate that is higher than the first failure rate; (C) testing the bipartite graph to determine whether parity sets generated pursuant to the bipartite graph are capable of decoding their corresponding data sets corrupted with the second quantity of corruption for a sufficient number of samples to satisfy the second failure rate; and (D) determining that the bipartite graph defines parity sets suitable to protect their corresponding data sets against the first quantity of corruption within the first failure rate when parity sets generated pursuant to the bipartite graph are capable of decoding their corresponding data sets corrupted with the second quantity of corruption for a sufficient number of samples to satisfy the second failure rate. Other embodiments are directed to at least one computer readable medium and an apparatus that implement this method.

BRIEF DESCRIPTION OF THE DRAWINGS

FIG. 5A is an example of a representation of the bipartite graph of FIG. 1 from a data-centric point of view;

FIG. 5B is an example of a representation of the bipartite graph of FIG. 1 from a parity-centric point of view;

FIG. 6 is an example of a method for rounding the number of parity points of a particular degree selected by a formula according to one embodiment of the invention;

DETAILED DESCRIPTION

Figure 1:
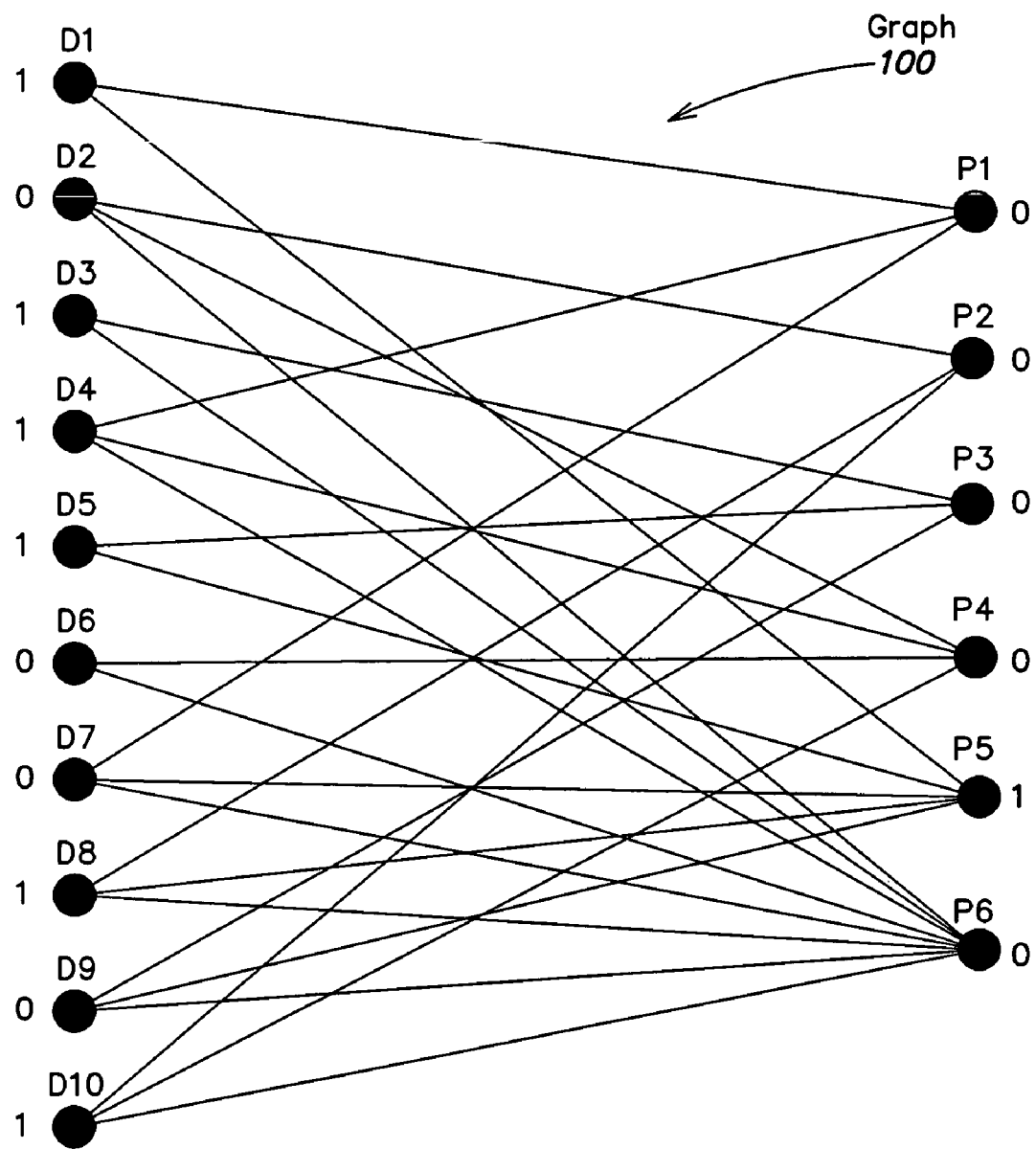
FIG. 1 is an example of a bipartite graph according to one embodiment of the invention.

One embodiment of the present invention is directed to a method and apparatus for protecting a data set with a parity set created using a bipartite graph, and wherein the parity points in the bipartite graph are selected to have a degree distribution that has been found to be particularly advantageous. In one embodiment, the degree distribution is defined by a particular formula discussed in more detail below.

In accordance with another illustrative embodiment of the present invention, a method and apparatus is provided for protecting a data set using a code defined by a bipartite graph that is truncated at the low degree, such that the parity points are selected to have a degree distribution that includes no parity points having low degrees. It has been found that codes formed according to such a bipartite graph can provide particularly advantageous results.

In a further illustrative embodiment of the present invention, a method and apparatus is provided for protecting a data set using a code defined by an irregular bipartite graph that is transmitted along with the data. It has been found that transmitting the data along with a code formed according to an irregular bipartite graph provides particularly advantageous results.

In addition to particular error codes, other embodiments of the present invention are directed to techniques for improving processing speed when decoding and/or encoding a data set with a parity set. In one embodiment, a decoding log is maintained to store actions taken while decoding a data set to address a particular corruption, such that if that particular type of corruption is recurring, the later occurrences can be easily decoded by performing the actions stored in the decoding log. In another embodiment, two data structures are created to assist in decoding a data set using a parity set, including a first data structure that is indexed by the data bits and identifies which parity bits correspond thereto, and a second data structure that is indexed by the parity bits and identifies which data bits correspond thereto. While the use of two data structures may provide for some redundant information, it can improve processing speed while decoding the data set as discussed below.

Finally, in a further embodiment of the present invention, a technique is provided for selecting a particular bipartite graph that satisfies a defined distribution of parity points to assure that it is suitable to protect a data set against a specified quantity of corruption at a specified failure rate. The technique includes selecting a relaxed failure constraint and then testing numerous bipartite graphs against a higher quantity of corruption to select a graph that performs well under these conditions. In this respect, Applicants have discovered that selecting a graph that can satisfy a relaxed failure constraint at a higher quantity of corruption than is necessary is a good indicator that the graph will also perform well and satisfy a much more constrained failure rate at a smaller quantity of corruption. It should be appreciated that by testing the graph against a relaxed failure constraint, significantly fewer samples are necessary, thereby improving processing time in selecting a satisfactory graph.

As discussed above, in one embodiment of the invention, an irregular bipartite graph is used to create a code. A code is a bit or plurality of bits which may be used to correct corruptions in a data set. As used herein, the term corruption includes both error corruptions and erasure corruptions. An error corruption is a corruption in which one or more bits of the data set are altered and the position of the altered bits in the data set may be unknown to the decoder. An erasure corruption is a corruption in which one or more bits of the data set are missing, and the position of the missing bits in the data set is known to the decoder.

An example of an irregular bipartite graph 100 is shown in FIG. 1. Graph 100 includes a first set of data points D1–D10 which each represents a data symbol, and that collectively represents a data set to be protected. A data symbol represents one or more bits of the data set, with the size of the data symbol specifying the number of bits. It should be appreciated that any suitable data symbol size may be used, as the invention is not limited in this respect. For example, for a data symbol size of two, each data point in the graph represents two bits of the data set, for a data symbol size of three, each data point represents three data bits, etc. In the example of FIG. 1, a data symbol size of one is used, such that each data symbol in graph 100 represents one bit of the data set. It should be understood that this data symbol size is given only as an example. A larger data symbol size may be used, which simplifies the formation of the graph by reducing the number of points to be created.

Graph 100 also includes a second set of parity points P1–P6 which is used to define a parity set. A parity set includes a plurality of parity bits which may be used to protect the data set against error corruptions and/or erasure corruptions. Similar to the data points, each parity point represents a parity symbol that includes one or more bits of the parity set, with the size of a parity symbol referring to the number of parity bits represented. It should be appreciated that any suitable parity symbol size may be used, as the invention is not limited in this respect, and may correspond to the data symbol size such that each interconnected pair of data and parity points can represent a relationship between numbers of data and parity bits equal to the symbol size. For example, for a data and parity symbol size of two, each interconnected pair of data and parity bits can represent a relationship between a first pair of data and parity bits and a second pair of data and parity bits. In the example of FIG. 1, a parity symbol size of one is used, such that each parity point in graph 100 represents one bit of the parity set. It should be understood that this parity symbol size is given only as an example, as a larger parity symbol size may be used.

The parity points P1–P6 in graph 100 correspond to the data points D1–D10, with the relationship between the parity and data points being defined by the edges of graph 100. A parity point corresponds to a data point when there is an edge (a line in FIG. 1) connecting the two. The value of the parity bits represented by the parity point is a function of the data bits represented by the data points which are connected to the parity point. For example, parity point P1 corresponds to data points D1, D4, and D7 because there is an edge between parity point P1 and each of the data points D1, D4, and D7. Accordingly, the value of the parity bits represented by point P1 is a function of the values of the bits represented by data points D1, D4; and D7.

In one embodiment, the function used to compute the value of the parity bits for a corresponding set of data bits may be any function that enables any single missing or erroneous data bit to be determined or detected, such as an exclusive-OR (XOR) function. Using an XOR function, the value of a parity bit is computed by calculating the XOR of its corresponding (as defined by the bipartite graph) data bits. In the example of FIG. 1, the value of the parity bit represented by parity point P1 is the XOR of the data bits represented by data points D1, D4, and D7. Consequently, the value of the parity bit represented by parity point P1 is 0 (i.e., 1 XOR 1 XOR 0). As a result, when decoding the data set, a parity bit can be used to correct or recover a corrupted one of its corresponding data bits when a single one of the corresponding data bits is corrupted. The corrupted data bit may be corrected by computing the XOR of the corresponding non-corrupted data bits and the parity bit.

As mentioned above, the present invention is not limited to employing an XOR function, as any suitable function can be used. For example, an exclusive-NOR (XNOR) function may be used. Indeed, any function that can be used to recover from a corruption of one of its corresponding data bits may be used to compute the value of a parity bit.

Furthermore, in accordance with the embodiment of the present invention that employs symbols, such that each parity point and/or each data point in the graph can correspond to multiple bits, a function can be employed to generate the parity bits that is not restricted to employing parity bits and data bits that have the same positioning within the symbol. Thus, functions can be employed that interrelate data bits and parity bits that have different positions within the symbol, such that data symbols and parity symbols can be collectively decoded as a group. Thus, the invention is not limited to the use of a function that enables decoding when only a single missing or erroneous data bit is included in a group of data and parity bits that share a position within the symbol.

While parity point P1 corresponds to three data points, other parity points in graph 100 correspond to different numbers of data points, such that the graph is an irregular bipartite graph. For example, parity point P5 corresponds to five data points and parity point P6 corresponds to eight parity points. The degree of a parity point is defined by the number of data points to which it corresponds. Stated another way, the degree of a parity point is equal to the number of edges connected to that parity point. For example, in FIG. 1 the degree of parity point P1 is three, the degree of parity point P5 is five, and the degree of parity point P6 is eight.

To protect a data set against corruptions, a parity set may be created by calculating the parity bits corresponding to the parity points in the graph by applying the selected function (e.g., XOR) to the data bits represented by the data points that correspond to the parity points. In accordance with one embodiment of the invention, both the data set and the parity set are used to decode a corrupted data set. In one aspect of this embodiment, the data and parity sets are both transmitted to a receiver. Transmitting to a receiver may include transmitting the data set and parity set from any source to any target over any communication medium (e.g., through a computer network, over a local bus of a computer system, or any other communication medium), as the present invention is not limited in this respect.

In one embodiment of the invention, a parity set is created to protect a data set stored on a storage medium (e.g., a compact disc, a ROM, a large scale storage system using drives or other storage devices, or any other storage medium). The data set and parity set may be stored on the storage medium so that if the data set is corrupted on the storage medium, it can be corrected using the parity set. It should be understood that it is not necessary to store the data set and parity set together, as the data and parity sets may be stored in different locations on the same storage medium or on different storage media.

Figures 2, 3:
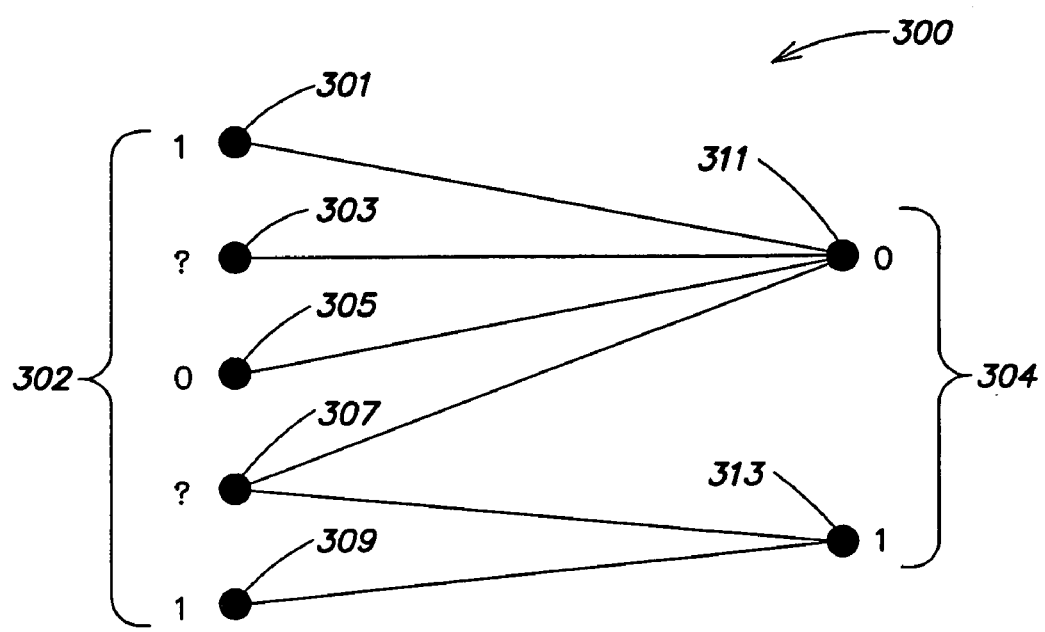
FIG. 2 is a table showing the parity point degree distribution for the graph of FIG. 1.
FIG. 3 is an example of a bipartite graph with corrupted data symbols.
Figure 7:
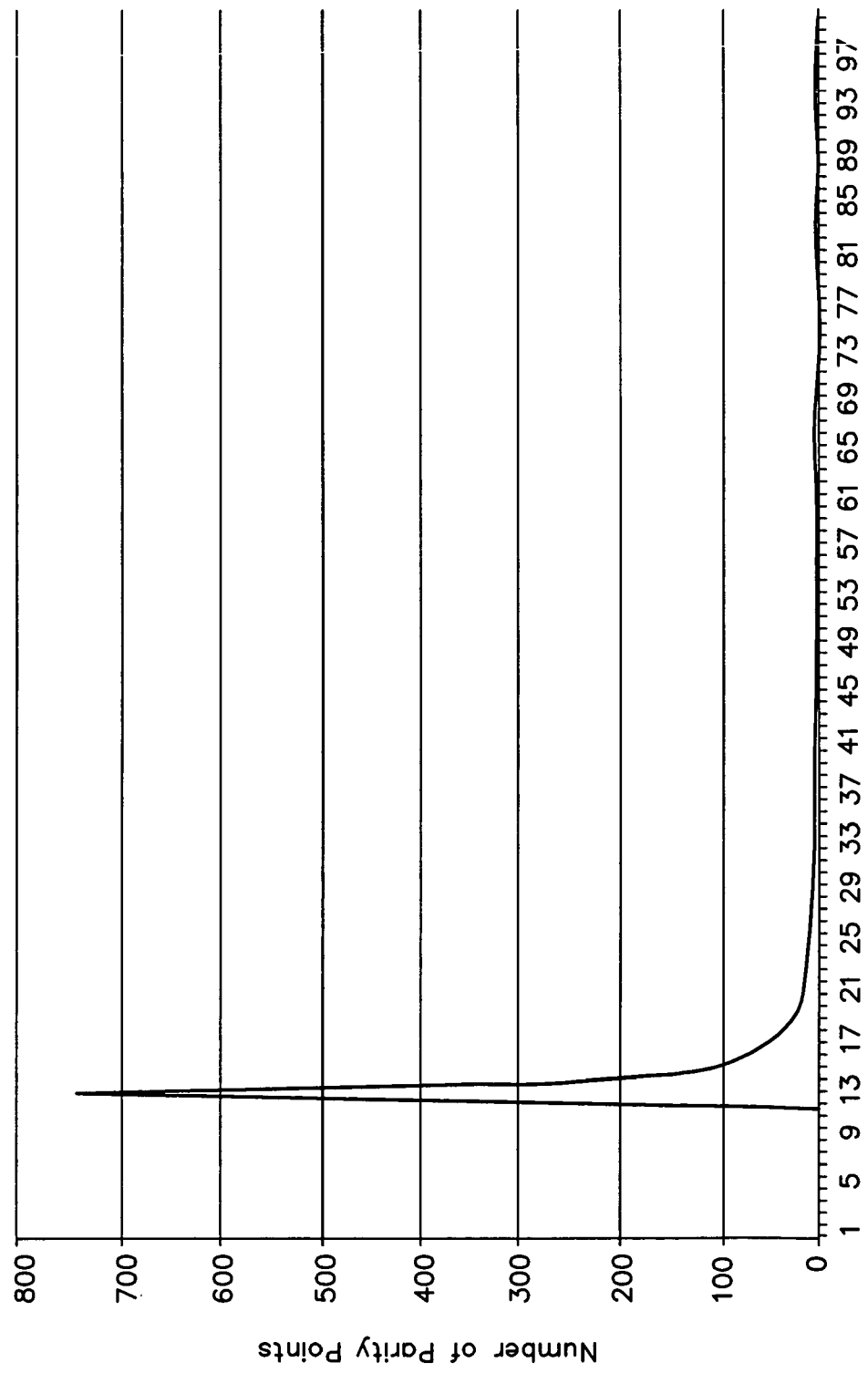
FIG. 7 is a plot of a degree distribution according to one embodiment of the present invention.

As discussed above, graph 100 is an irregular bipartite graph. An irregular graph is a graph whose data points do not all have a common degree and/or whose parity points do not all have a common degree, while in a regular graph all data points have the same degree, and all parity points have the same degree (although the degrees may differ between the data and parity points). The number of parity points in the graph at different degrees defines a degree distribution for the graph. The degree distribution for graph 100 of FIG. 1 is shown in FIG. 2. As shown in FIG. 2, three parity points in graph 100 have a degree of three, one parity point has a degree of four, one parity point has a degree of five, one parity point has a degree of eight, and there are no parity points with degrees of one, two, six or seven. While shown in table form in FIG. 2, a parity point degree distribution can also be plotted in graphical form as shown in FIG. 7 for a much larger graph as discussed in detail below.

The effectiveness of a bipartite graph (i.e., the effectiveness of parity sets created pursuant to the graph) can be judged by the failure rate of the graph in recovering from corruptions of a given magnitude. The magnitude defines the extent of the corruption, which can be defined by a total number of corrupted bits, or more typically by a percentage of the data set which is corrupted. The failure rate defines (typically as a percentage) the rate at which the graph fails to recover from corruptions of the specified magnitude.

Applicants have appreciated that the effectiveness of a bipartite graph is determined, at least in part, by the degree distribution for the parity points. In accordance with one embodiment of the present invention, Applicants have discovered a class of degree distributions that are particularly effective. A plot of an example degree distribution falling within this class of distributions is shown in FIG. 7, which will be described in more detail below.

One manner of specifying a degree distribution that falls within the class of distributions defined in accordance with one embodiment of the present invention is through the use of one or more formulas that define such a degree distribution. One formula for determining the number of parity points in a bipartite graph with degree j in accordance with one embodiment of the present invention is shown in Table 1 below. The formula in Table 1 may be used to calculate the number of parity symbols $N_1$ for each j from 1 to imax, where imax is defined as the maximum possible degree for any parity points in the bipartite graph. That is, although there may or may not be a parity point having a degree of imax, there will not be a parity point having a degree greater than imax. The formula shown in Table 1 includes a number of variables that are illustrated in Table 1. These variables, as well as techniques for selecting at least some of them in a particularly effective manner are described below in connection with Table 4, which is a variant of the formula shown in Table 1 as will be explained in more detail below.

Table 2 shows a formula for calculating the total number of parity points in a bipartite graph created to have the degree distribution defined by the equation in Table 1. As shown in Table 2, the total number of parity points can be calculated by summing the number of parity points with degree j, for each j from 1 to imax.

TABLE 1

$$N_j = s\left(\frac{pk}{j} - \frac{pk + 1 - A\sqrt{pk}}{j+1}\right), \text{ for } j = 1, \ldots, \text{imax}$$

p = fraction of corruption being protected against
k = number of data points in the bipartite graph
s = scaling factor
A = variable
imax = maximum possible degree for the parity points in the bipartite graph

TABLE 2

$$z = \sum_{j=1}^{\text{imax}} N_j$$

z = total number of parity points in the bipartite graph
imax = maximum possible degree for the parity points in the bipartite graph Using the formula shown in Table 1, $N_1$ may not be an integer for some values of j. Because it is desirable to have an integral number of parity points of a given degree, each $N_j$ may be rounded. One method of rounding is to simply truncate the value of each $N_1$ such that the decimal part is simply discarded. However, this method may be undesirable in some situations because there may be fewer parity points in the graph than the number of parity points that the formula of Table 1 specifies, as a result of the value of each $N_1$ being truncated.

In accordance with one embodiment of the invention, a technique is employed to round the values of $N_j$ without decreasing the total number of parity points in the graph. This can be done in any of numerous ways, as the present invention is not limited to any particular rounding technique. One illustrative implementation is shown in Table 3, where the operator Int is a unary operator which takes a real number as its operand. The result of the function is the integer part of the operand. That is, the decimal part of the operand is discarded and the result is the integer part of the operand.

TABLE 3

$$\sum_{j=1}^{\text{imax}} N_j = \text{Int}\left[s \sum_{j=1}^{\text{imax}} \left(\frac{pk}{j} - \frac{pk + 1 - A\sqrt{pk}}{j+1}\right)\right]$$

p = fraction of corruption being protected against
k = number of data points in the bipartite graph
s = scaling factor
A = variable
imax = maximum possible degree for the parity points in the bipartite graph An example of rounding using the formula of Table 3 is shown in FIG. 6, wherein the variable x is defined as everything inside the inner summation of the formula in Table 3. Example values of x are shown for each j, from 1 to imax, where j represents a degree and $N_j$ represents the number of parity symbols in the graph with degree j. In this example, imax is equal to 5. Steps 601–609 (FIG. 6) illustrate a step-by-step computation of the summations 601 and 602 of formula 600.

With j=1, as shown in step 601, x=1.5. Thus, summation 602 is equal to the integer part of 1.5, or 1. At step 603, when j=2, x=0.2. Thus, summation 602 is equal to the integer part of 1.7 (1.5+0.2), which is 1. Because $N_1$ was determined to be 1 in step 601, $N_2$ is 0, to ensure that the sum of $N_1$ and $N_2$ is 1. In step 605, x=0.2 for j=3. Thus, summation 602 is equal to the integer part of 1.9 (1.5+0.2+0.2), which is 1. Because $N_1$ was previously determined to be 1 and $N_2$ was previously determined to be 0, $N_3$ is also set to 0 so that the sum of $N_1$, $N_2$, and $N_3$ is 0. At step 606, summation 602 is equal to the integer part of 2.1 (1.5+0.2+0.2+0.2), or 2. Because the summation of $N_1$, $N_2$, $N_3$, and $N_4$ equals 2, and the summation of $N_1$, $N_2$, and $N_3$ equals 1, $N_4$ is set to 1. At step 609, the same process is repeated and $N_5$ is determined to be 0. Using this technique, each $N_j$ has an integer value and the total number of parity symbols in the graph is not reduced due to truncation.

It should be appreciated that the above-described technique for rounding the values of $N_j$ without decreasing the total number of parity points in the graph is provided merely for illustration, as the present invention is not limited in this respect, such that other rounding techniques can be employed.

When a data set is decoded using a corresponding parity set, parity bits corresponding to parity symbols of high and low degree serve different functions. It should be appreciated that when performing a decoding operation to determine the values of corrupted data bits, it is desirable to identify corresponding sets of data and parity bits where there is only a single corrupted data bit, such that the value of the corrupted data bit can be determined using the other data bits and the corresponding parity bit. As low degree bits have a relatively smaller number of data bits corresponding thereto, there is a higher probability at the beginning of the decoding process of identifying a low degree parity bit that relates to only one corrupted data bit, such that the value of the corrupted data bit can be determined. However, it should be appreciated that since it is desirable to minimize the number of parity bits employed, it is generally not advantageous to protect every data bit with a corresponding low degree parity bit. Thus, as progress is made in the decoding process, the parity bits having a high degree can be particularly advantageous later in the decoding process, as they will relate to a larger number of data bits, thereby increasing the probability that a high degree parity bit will relate to any particular corrupted data bit that remains to be decoded.

An illustrative decoding process is described in a very simplified example in FIG. 3, which illustrates a bipartite graph 300 and a corresponding data set 304 and parity set 302. Two data bits of data set 302 are erased (as shown by the question marks in FIG. 3), i.e., the bits represented by data points 303 and 307. The corrupted data bits cannot initially be determined by the parity bit represented by the relatively high degree parity point 311 (which has a degree of four), because there are two corrupted data bits corresponding thereto. However, for the parity bit corresponding to parity point 313, there is only one corresponding data bit that is corrupted, so that its value can be determined using the data bit corresponding to data point 309 and the parity bit corresponding to parity point 313. Once the data bit represented by data point 307 is determined, the data bit represented by data point 303 can be determined using the parity bit corresponding to parity point 311.

Applicants have appreciated that for some applications (e.g., wherein the data set is used along with the parity set in the decoding process), better performance is achieved using a bipartite graph having a degree distribution with very few, (and more preferably no), low degree parity points. In this respect, for a parity set of a given size, it has been appreciated that better performance can be achieved by allocating parity points to have a relatively higher degree.

Thus, in one embodiment of the invention, the degree distribution is truncated so that any parity points with a degree less than a threshold are omitted from the graph.

It should be appreciated that any suitable threshold can be used, as the invention is not limited to any particular threshold value. For example, a threshold of three, four, five, six, seven, eight, nine, ten or more can be used. It should be appreciated that the principle underlying the embodiment of the present invention that truncates parity points below a degree threshold is that the parity set will be more effective if parity points are employed that have a higher degree. This principle can obviously be achieved by employing an insubstantial number of low-degree parity points that will not meaningfully impact the performance of the overall degree distribution. A degree distribution that employs an insignificant number of low-degree parity points is considered to fall within the embodiment of the present invention that truncates the degree distribution to not employ any meaningful number of low-degree parity points below a chosen threshold.

A formula for computing a family of parity point degree distributions in accordance with one embodiment of the present invention directed to the use of a bipartite graph that does not include any meaningful number of low-degree parity points is shown in Table 4. This formula is similar in many respects to the formulas discussed above, but restricts the degree distribution to include no parity points below a specified degree threshold. In the formula of Table 4, $N_j$ is equal to zero for all degrees (i.e., values of j) between zero and a specified threshold defined by j*+1.

TABLE 4

$$N_j = 0, \text{ for } j = 1, \ldots, j*+1$$

$$\sum_{j=j*+2}^{imax} N_j = \text{Int}\left[s \sum_{j=j*+2}^{imax} \left(\frac{pk}{j-j*-1} - \frac{pk+1-A\sqrt{pk}}{j-j*}\right)\right]$$

p = fraction of corruption being protected against
k = number of data points in the bipartite graph
s = scaling factor
A = variable
imax = maximum possible degree for the parity points in the bipartite graph
j* = degree of a minimum non-zero degree parity point minus two A sample degree distribution created using the formula of Table 4 is shown in the attached appendix. In the Appendix, the columns labeled ND represent the degree of a parity point and the column to the right labeled SD represents the number of parity points in the graph which have that degree. For example, where ND is 12, SD is 742. This indicates that there are 742 parity points in the graph which have degree 12. Similarly, where ND is 109, SD is 1, indicating that there is one parity point in the graph which has a degree of 109. The parameters used to create this distribution are p=0.2, k=5040, A=1, ima=2229, j*=10, and s=1.43. It should be appreciated, however, that by changing the values of some or all of these parameters, different degree distributions may be generated. Such degree distributions are intended to be within the spirit and scope of the invention.

FIG. 7 is a portion of a plot of the degree distribution shown in the Appendix. For the sake of clarity, the plot in FIG. 7 has been truncated to show only parity points having degrees less than one hundred. As can be seen from FIG. 7 and the Appendix, there are no parity symbols having a degree between zero and ten, i.e., the distribution has a low degree threshold of ten. It should be appreciated that the degree distribution shown in the Appendix and FIG. 7 is given only as an example, as many other degree distributions may be generated using the formula of Table 4.

The precise degree distribution generated by the formula of Table 4 depends on the values of the parameters used in the formula. There are six parameters associated with this formula: p, k, imax, s, j*, and A. The values of p and k may be specified by a user, depending on the fraction of loss that a user wishes to protect against, and the size of the data set to be protected. In this respect, it should be appreciated that in accordance with one embodiment of the present invention, the degree distribution is selected to be capable of complete recovery of the entire data set with a high probability of success. Thus, while some codes may be optimized to correct large portions of a data set and might be considered to have successfully completed even if complete recovery has not been achieved, one embodiment of the present invention seeks to achieve complete recovery of the data set with a high probability of success. In establishing the value of p that establishes the fraction of loss to be protected against, it should be appreciated that there are some tradeoffs involved, as it will typically require a larger number of parity bits to protect against a larger fraction of loss for any given failure rate.

The desired failure rate of the graph may be used as a rough guideline in selecting parameters. The failure rate of a graph for a particular rate of loss refers to a measure of the number of times the data set can be recovered in the event of a loss (randomly distributed throughout the data set) at the specified loss rate.

As opposed to having the user specify the rate of loss to be protected and the probability of failure to be tolerated, one embodiment of the present invention enables a user to specify the number of bits in the data set, as well as the maximum number of parity bits that the user is willing to support. Using this information as inputs to the formula in Table 4, a degree distribution can be generated that provides a good level of protection given the number of parity bits supported.

In one embodiment of the present invention, the user can specify the coding using either of the two above-described options to provide the user with some flexibility. However, it should be appreciated that the present invention is not limited in this respect, as alternate implementations are possible where only one of these options is provided to a user.

The value of imax can be computed using the variables s, j*, n, and A. A method of selecting values for these three parameters according to one embodiment of the invention will now be described. In one embodiment a function R(j*, A, s, p, k, n) is defined, where n represents the total number of points (data points+parity points). The value of n may be calculated by selecting values for s, j*, A, J, and k, and then using the formula to calculate how many parity points are in the graph.

The function R(j*, A, s, p, k, n) defines a failure rate for at least one bipartite graph created according to the distributions defined by varying the parameters of the function. Thus, by picking particular values for the parameters and performing experiments on them, a curve can be created for the function R(j*, A, s, p, k, n) that plots the failure rate for the bipartite graphs created pursuant to the plotted parameters. As the curve is generated by plotting the failure rate of a graph against the parameters used to create the graph, the low point on the curve provides the most advantageous set of parameters for the plot.

Figure 11:
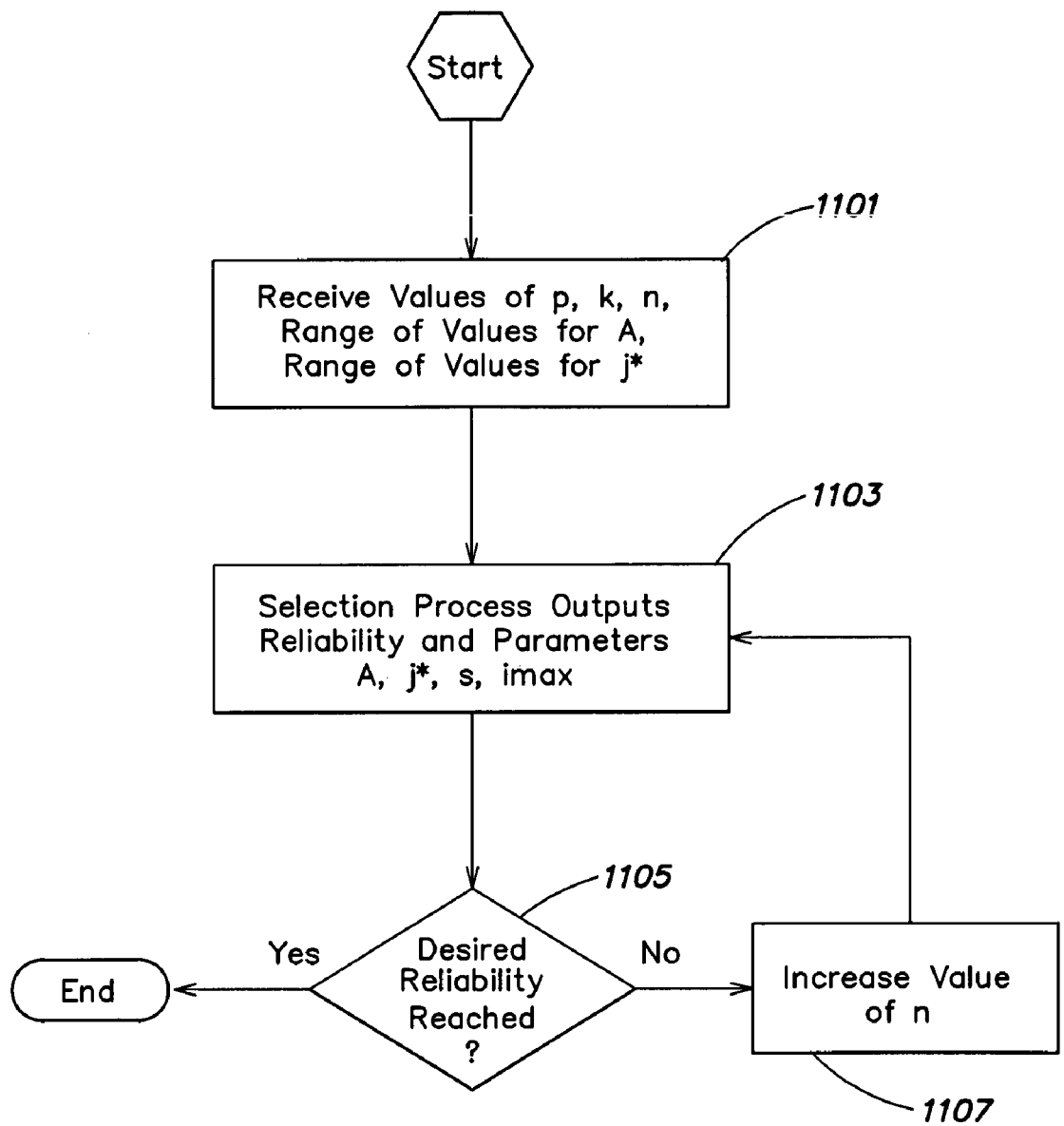
FIG. 11 is a flow chart of an illustrative process for selecting values of parameters for the formula of Table 4 according to one embodiment of the present invention.

FIG. 11 illustrates an example of a process for determining values of A, j*, s, and imax. This process is described merely for illustrative purposes, as the present invention is not limited to this process for determining appropriate values for the parameters, as other techniques are possible. Initially, in act 1101, the process receives (e.g., from a user or another process) input values for p, k, and n, a range of values for A, and a range of values for j*. Testing has shown that a good value of A is approximately 1, so the range for A may be set from 0.5 to 3.0. It should be appreciated that this range of values for A is given only as an example, as other values for A could be used, as the invention is not limited in this respect. Educated guesses for the values of n and j* may initially be made based on previous empirical data. In this respect, Tables 5–8 may be used as a guide for selecting appropriate values of n and j* based on the expected loss rate (p), given a particular size of the data set to protect (k), and a particular target reliability.

TABLE 5

5040 data bits, targeting $10^{-6}$ reliability

| Percent Loss | No. of Parity Bits (n) | Range of j* |
|---|---|---|
| 1 | 130 | 160 to 200 |
| 10 | 860 | 18 to 25 |
| 20 | 1760 | 8 to 12 |
| 50 | 6340 | 0 to 3 |
| 75 | 20000 | 0 to 3 |

TABLE 6

5040 data bits, targeting $10^{-4}$ reliability

| Percent Loss | No. of Parity Bits (n) | Range of j* |
|---|---|---|
| 1 | 110 | 160 to 200 |
| 10 | 810 | 18 to 25 |
| 20 | 1700 | 8 to 12 |
| 50 | 6230 | 0 to 3 |
| 75 | 19250 | 0 to 3 |

TABLE 7

2520 data bits, targeting $10^{-6}$ reliability

| Percent Loss | No. of Parity Bits (n) | Range of j* |
|---|---|---|
| 1 | 80 | 160 to 200 |
| 10 | 470 | 18 to 25 |
| 20 | 950 | 8 to 12 |
| 50 | 3360 | 0 to 3 |
| 75 | 10400 | 0 to 3 |

TABLE 8

2520 data bits, targeting $10^{-4}$ reliability

| Percent Loss | No. of Parity Bits (n) | Range of j* |
|---|---|---|
| 1 | 65 | 160 to 200 |
| 10 | 435 | 18 to 25 |
| 20 | 900 | 8 to 12 |
| 50 | 3240 | 0 to 3 |
| 75 | 10100 | 0 to 3 |

As can be seen from Tables 5–8, an appropriate range of values for j* can be selected looking solely to the rate of loss. If the desired rate of loss is not specified in Tables 5–8, interpolation can be used to arrive at a range of values of j*. Similarly, if any combination of the specified criteria (e.g., number of data bits, target reliability, and percent loss) are not within any of the Tables 5–8, interpolation also may be used to estimate values for n.

At act 1103, a selection process (such as a hill climbing technique discussed below) is used to select values for each of the parameters for the formula of Table 4. Thus, values for s and imax are computed, and specific values of A and j* are selected to be within the ranges received in act 1101. The process also outputs the reliability of a graph based on the degree distribution created with those values. At act 1105, a determination is made as to whether the reliability output by the process satisfies the specified reliability (e.g., specified by the value of p), and if so, the process ends. When it is determined that the desired reliability has not been satisfied, the process proceeds to act 1107, wherein the number of parity points in the graph (i.e., the value of n) is increased to provide greater reliability, and the process returns to act 1103 which is repeated with the new value of n.

It should be appreciated that the process may iterate through acts 1103, 1105 and 1107, continually increasing or decreasing the number of parity bits n, until the desired level of reliability has been achieved.

Figure 12A:
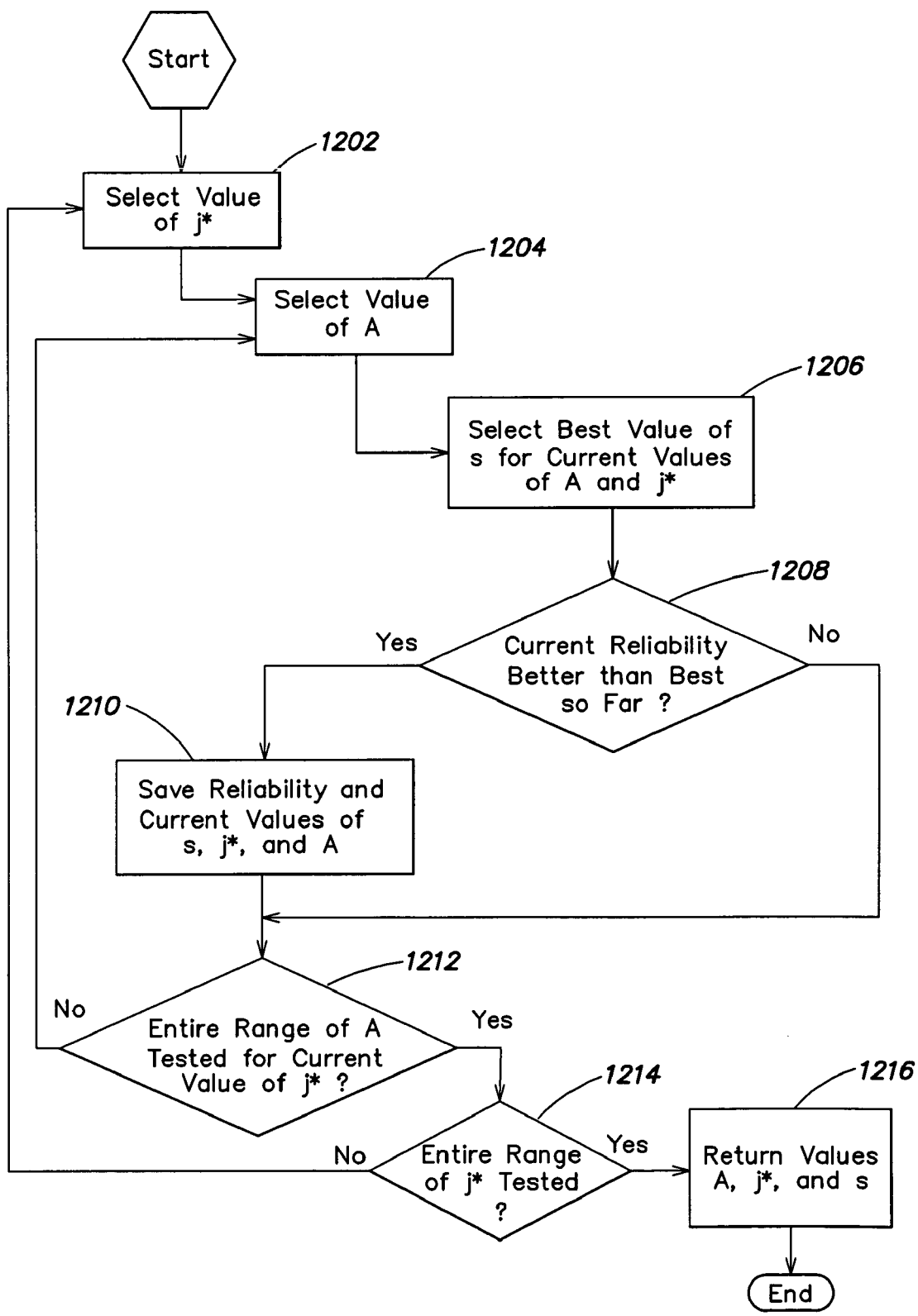
FIG. 12A is a flow chart of an illustrative process for performing the selection process of act 103 of the process of FIG. 11 according to one embodiment of the invention.
Figure 12B:
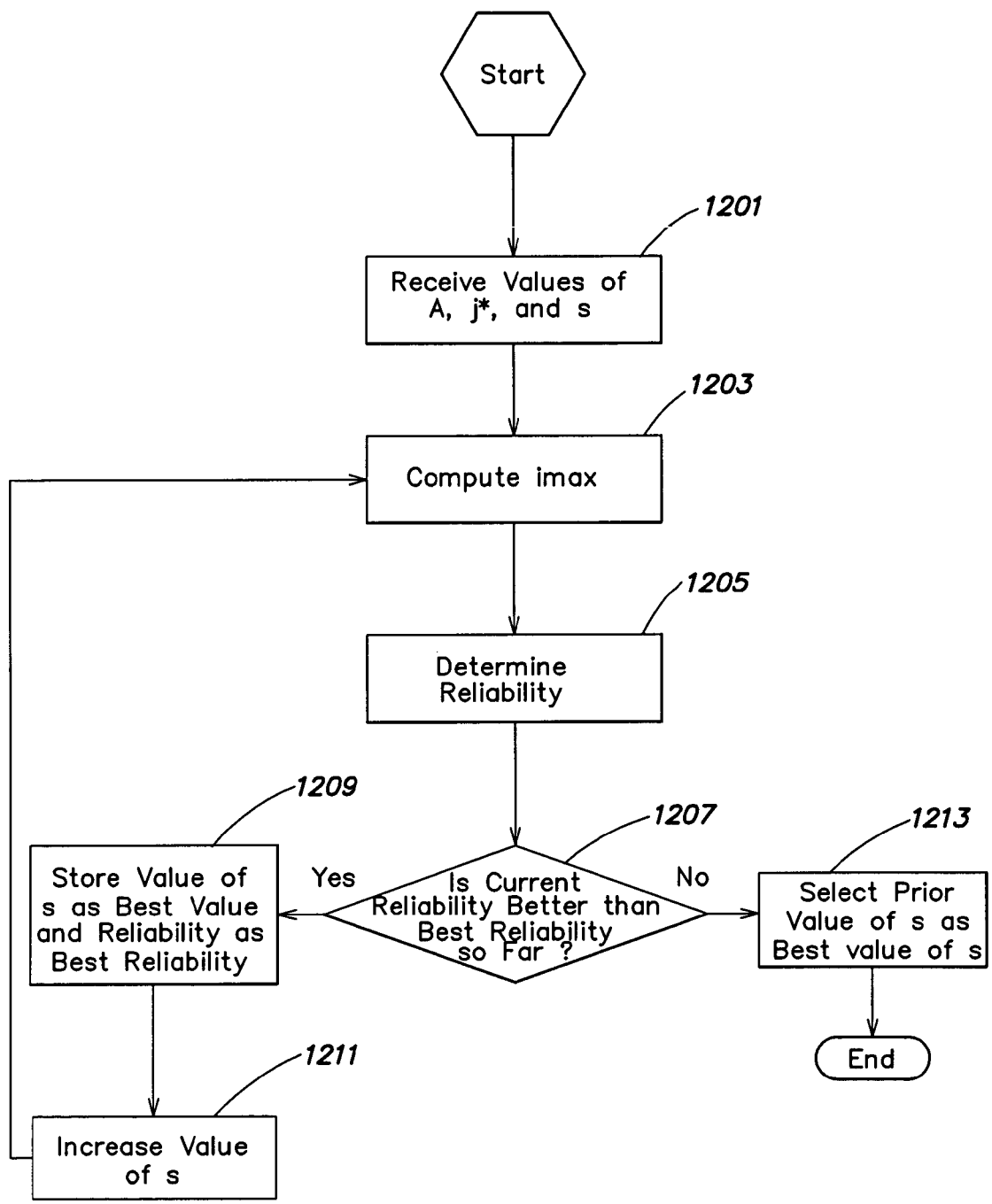
FIG. 12B is a flow chart of an illustrative process for selecting a best value of s as specified in act 1206 of FIG. 12A.

One selection process (which can be called in act 1103) for selecting values of A, j*, s, and imax and determining the reliability of a graph based on a degree distribution created using those values is shown in FIGS. 12A and 12B. It should be appreciated that this process is shown merely for illustrative purposes, as numerous other techniques are possible.

As will be described below, the process of FIG. 12A may be viewed as a three level nested loop. In the inner loop, a range of values are selected for s, searching for the value of s that produces the most reliable distribution for given values of j*, A, n, k, and p. In the middle level loop, the value of A is stepped through its entire range, searching for the most reliable distribution produced by any combination of values for A and s for a given value of j*. Finally, in the outer loop, the value of j* is stepped through its entire range, searching for the most reliable distribution produced by any combination of values for j*, A and s.

The process of FIG. 12A initially (at act 1202) selects a value of j* based on the previously determined range of values for j*. In one embodiment, the value of j* selected at act 1202 may be the lowest value in the range, such that upon each iteration the value of j* is increased until the upper limit of the range is reached, although the range of values of j* can be processed in any order. The process then proceeds to act 1204, where a value of A is selected based on the previously determined range of values for A. Similar to the value of j*, the value of A selected at act 1204 may be the lowest value in the range, such that upon each iteration the value of A is increased until the upper limit of the range is reached, or some other processing order can be employed. The process then proceeds to act 1206, where the value of s is selected that yields the greatest reliability for the current values of A and j*. The selection of the best value of S will be discussed in greater detail below with respect to FIG. 12B. The process then proceeds to act 1208, wherein a determination is made as to whether the current reliability (i.e., that returned from the process of FIG. 12B) is better than the best previously saved reliability. When it is, the process proceeds to act 1210, wherein the current reliability and values of s, j*, and A are saved as the best reliability.

After the current values and reliability are saved in act 1210, or when it is determined in act 1208 that the current reliability is not the best so far, the process proceeds to act

1212, wherein a determination is made as to whether the entire range of values for A has been evaluated for the current value of j*. Stated another way, for each value of j*, each combination of values of A and s will be evaluated for reliability. Thus, when it is determined that the range of values of A has not yet been exhausted for the current value of j*, then the process returns to act 1204, where a new value of A is selected. When it is determined that the range of values of A has been exhausted for the current value of j*, then the process proceeds to act 1214 where it is determined if the entire range of values of j* has been evaluated. When it is determined that the entire range of values for j* has been evaluated, then the process proceeds to act 1216, wherein the saved values of the parameters (i.e., A, j*, s) that generated the best reliability are returned for use in the formula of Table 4. When the range of values of j* has not been exhausted, then the process returns to act 1204 where a new value of j* is selected. In this manner, the process of FIG. 12A determines the combination of values of j*, A and s that provides the best reliability.

FIG. 12B illustrates a process to determine the best value of s for a particular pair of values of A and j*. At act 1201, values of j* and A are received. An initial value of s may also be received. In one embodiment, the initial value of s is selected to be at the bottom (or top) of the range of possible values for s, so the value of s may be incremented (or decremented) sequentially throughout the process until the most suitable value is found. This is advantageous because Applicants have discovered that the reliability curve tends to be convex, so that processing the values of s from the top or bottom of the range is an efficient technique for finding the best value of s.

At act 1203, the value of imax may be computed based on the selected values of the other parameters. For example, the formula of Table 4 may be used to calculate each $N_j$ until the sum of all values of $N_j$ is greater than or equal to the value of n. Then, the value of j for the last $N_j$ may be used as the value of imax.

At act 1205, the reliability for a distribution created based on the selected parameter values may be determined by creating a plurality of graphs and testing each one against the desired loss rate to determine if it adequately protects the data set. Reliability of a degree distribution may be determined in various different ways. For example, reliability may be determined by creating a plurality of different bipartite graphs using the degree distribution and testing each of the plurality of different bipartite graphs with a plurality of different data sets which are randomly corrupted with the amount of corruption specified by the value of p. The reliability may be defined as the total number of data sets which could not be recovered divided by the total number of data sets tested. Alternatively, only one graph created based on the degree distribution, that is determined to perform well, may be tested. Similarly, in this situation, the reliability may be defined as the number of data sets that could not be recovered divided by the total number of data sets tested. Other ways of determining reliability are possible, and the present invention is not limited to any particular technique.

It should be appreciated that many different bipartite graphs may fit a particular degree distribution defined by the formula of Table 4, after the parameters have been selected as disclosed above. That is, there are many possibilities of drawing the edges in the graph between particular data and parity points to satisfy the specified degree distribution. In one embodiment of the invention, a particular bipartite graph may be selected by testing a plurality of bipartite graphs to find one that performs well (e.g., meets the desired failure rate). One method of testing a bipartite graph includes creating a plurality of sample data sets and determining their corresponding parity sets according to the bipartite graph being tested. A fraction of bits of each data set may then be corrupted. For example, a fraction corresponding to the loss to be protected against (variable p in Table 4) may be corrupted. The corresponding parity sets are then used to attempt to fully decode each sample data set. If all of the bits of a particular data set are decoded, then the data set passes the test. Otherwise, the data set fails. The failure rate of the graph is defined as the number of data sets which fail the test divided by the total number of tests. If a particular graph meets the specified failure rate, it is a satisfactory graph and may be selected. In accordance with one embodiment of the present invention, the first graph to satisfy the specified failure rate is not selected, as a number of graphs are tested, and the graph with the lowest tested failure rate is selected. However, the present invention is not limited in this respect.

It should be appreciated that any bipartite graph isomorphic to the selected graph is equally suitable. Indeed, any bipartite graph that is isomorphic to a bipartite graph which satisfies a degree distribution generated by the formula of Table 4 could be used in accordance with embodiments of the present invention. Stated another way, the names of the data and parity points and the location of the data and parity points in the graph may be altered as long as the relationship (as defined by the edges in the graph) between the data points and the parity points is not substantially changed.

Further, it should be appreciated that insubstantial modifications can be made to the graph so that it is not strictly bipartite. For example, an edge could be added between two data points. Of course, such an edge does not indicate any relationship between parity points and data points and thus could be ignored when creating a parity set or decoding a data set. Many other similar insubstantial modifications could be made such that the graph does not strictly satisfy the degree distribution generated by the formula of Table 4. Such modifications could be made, for example, by adding or removing an insubstantial number of edges or vertices from the graph. Graphs with such modifications are considered to fall within the embodiment of the present invention directed to a degree distribution defined by the formula of Table 4 .

At act 1207, a determination is made, based on the results of testing the graphs, as to whether the reliability of the degree distribution specified by the particular values for the parameters being processed is better than any reliability tested so far. When it is, the process proceeds to act 1209, wherein the current reliability and the value of s is stored. The process then proceeds to act 1211, wherein the value of s is increased and the process returns to act 1203 for re-processing with the new value of s. When it is determined at act 1207 that the current reliability is not the best so far, the process proceeds to act 1213, wherein the previously saved best value of s is returned as the best value for s, and the process ends.

The process of FIG. 12B is effective because Applicants have discovered that by fixing the values of A and j* and varying the value of s, the reliability curve tends to be convex. Thus, as the value of s increases from the low end of the range (or decreases from the high end), the reliability increases until the lowest point on the curve is reached. This point of the curve is the best reliability for the current values of s, A, and j*. After reaching this point, changing the value of s will decrease reliability. Thus, by increasing the value of s from the low end (or increasing it from the high end), once a value of s is found that is not better than the prior value of s, it may be determined that the lowest point on the curve, and hence the best reliability, has been found.

In the manner described above, each of the variables for the formula shown in Table 4 can be selected to create a particularly advantageous degree distribution. However, it should be appreciated that the present invention is not limited in this respect, and that the selection of the variables for the formula shown in Table 4 can be accomplished in other ways.

For desired failure rates that are very low (e.g., $10^{-7}$), it should be appreciated that a very large number of data set tests are necessary to provide a statistically meaningful result on which to gauge the performance of a graph. Since testing a large number of graphs against a large number of data sets may be very time consuming, one embodiment of the present invention is directed to a technique for improving the efficiency of the graph selection process. Applicants have discovered that the performance of a particular graph to withstand a specified percentage of loss within a specified failure rate can be accurately predicted by testing the performance of the graph for a significantly greater corruption percentage and passing the graph if it achieves satisfactory performance within a significantly relaxed failure rate. By employing a relaxed failure rate, fewer samples are needed to provide statistically meaningful results, thereby improving the efficiency of the graph-selection process. In accordance with one embodiment of the present invention, the relaxed constraints (and accompanying increased corruption percentage) is used as the sole indicator in determining a satisfactory graph. However, in an alternate embodiment of the present invention, the relaxed constraints are used as a first pass to identify a small number (e.g., one) of graphs that are likely to be acceptable, and then a set of tests can be executed against that small number of graphs with the specified percentage of data corruption to ensure that it satisfies the more stringent failure requirements specified by the user.

The embodiment of the present invention that employs increased failure percentages and reduced failure rates is not limited to any particular magnitude by which these requirements are modified, as any suitable modifications can be made. For example, the percentage of failure and the failure rate can both be doubled, or any other suitable modifications can be made, including those that are not evenly applied to the two requirements (e.g., the corruption rate could be doubled and the failure rate tripled).

As discussed above, it has been found that bipartite graphs having a degree distribution that substantially complies with the above-discussed formulas provide particularly satisfactory results that are better than other codes, for at least some applications. As further indicated above, the aspect of the present invention that relates to these novel degree distributions is not limited to degree distributions that concisely conform with the formula specified above, as degree distributions can be implemented that vary only insubstantially from the family of degree distributions specified by the formulas. In accordance with one embodiment of the present invention, the present invention is directed not only to codes that precisely conform to the family of degree distributions specified by the formulas described above, but also those that are substantially similar. One technique for determining substantial similarity between two degree distributions will now be described.

A degree distribution $M_j$ is defined herein as being substantially similar to the degree distribution $N_j$ if the maximum value of $|M_j - N_j|$, for all values of j, is less than a specified number. That is, the number of parity points of degree j in the distribution $N_1$ is subtracted from the number of parity points of degree j in the distribution $M_j$. This calculation is performed for each j from 1 to the maximum degree in either distribution. Then, when the maximum difference between any $M_j$ and $N_1$ is less than the specified number, the degree distribution $M_j$ is substantially similar to that of $N_1$. While the specified number is preferably equal to 5% of the number of data bits in the data set, and more preferably equal to 3% of the number of data bits in the data set, in one embodiment, the closeness required to define substantial similarity is more relaxed. Thus, for the purpose of the present application, a distribution is determined to be substantially similar when the specified number is equal to 10% of the number of data bits in the data set.

When a data set to be protected is to be transmitted or stored on a storage medium, a graph for the corresponding parity set may be selected prior to transmission or storage of the data set. A parity set may then be encoded for the data set.

Figure 8:
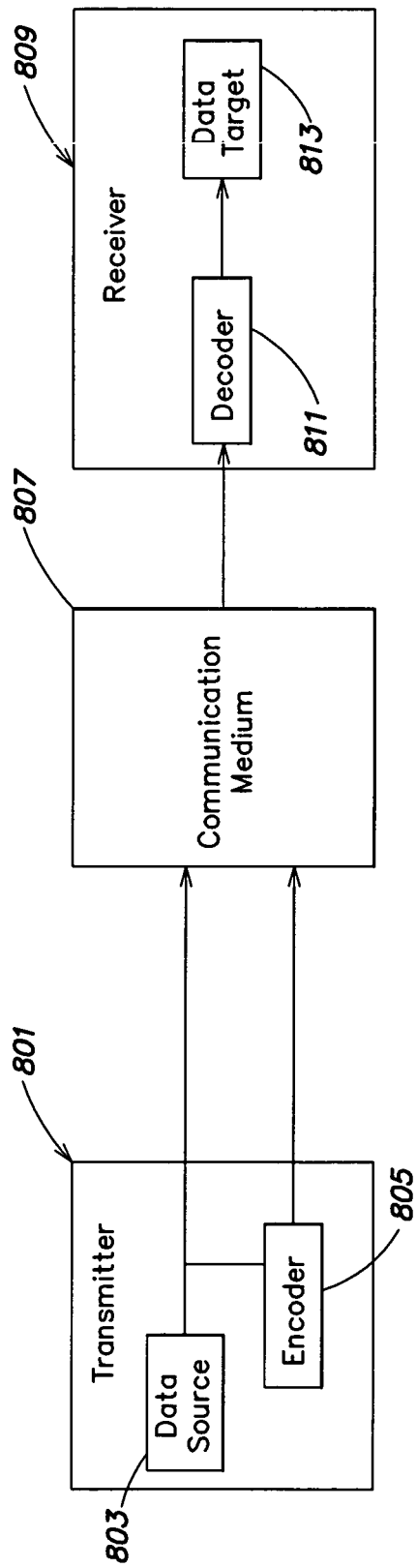
FIG. 8 is a block diagram of a communication system that employs an encoder and a decoder in accordance with one embodiment of the present invention.

An example of a system for protecting a data set prior to transmission is shown in FIG. 8. A transmitter 801 includes a data source 803 and an encoder 805. The data source 803 can be any source that produces or transmits the data set, such as any type of computer system or other device, as the present invention is not limited in any respect to the types of sources that may generate or transmit a data set to be protected. In FIG. 8, transmitter 801 communicates with a receiver 809 over a communication medium 807. The receiver 809 can be any type of device that is capable of receiving a data set, and the communication medium 807 can be any type of communication medium capable of transmitting data, as the present invention is not limited to any particular types of receivers or communication media. The communication medium could be any type of data link, including wireless links, in a computer network or could simply be the local bus system of the computer. As shown in FIG. 8, receiver 809 includes a decoder 811 and a data target 813 that is the destination for the transmitted data set.

In operation, the data set is provided by the data source 803 and made available to the encoder 805, which encodes a parity set to protect the data set using any of the embodiments of the present invention discussed above. The data set and its corresponding parity set are transmitted, through the communication medium 807, to the receiver 809. It should be appreciated that the present invention is not limited to any sequence for generating and transmitting the parity set, as this can be done in any sequence relative to transmission of the data set. Furthermore, it should be appreciated that the aspects of the present invention described herein can be employed with an encoder 805 that always and automatically generates a parity set for a data set, or alternatively, can be selectively enabled/disabled.

In one embodiment of the present invention, encoder 805 uses a previously-determined bipartite graph to create the parity set. Alternatively, in another embodiment of the present invention, the encoder 805 may create a bipartite graph in real time in response to an indication that a data set is to be encoded.

The data set and parity set are received, via the communication medium 807, at the receiver 809. The decoder 811 can be adapted to decode any corruptions (e.g., erasures or error corrections) in the data set using any of the embodiments of the present invention described herein, and can pass the data set on to the data target 813. It should be appreciated that the present invention is not limited to any sequence in terms of when the decoding operations are performed. For example, the decoder could simply pass through the parity bits and data set when received, that information can be stored in a storage device in the receiver 809, and the decoder can decode any corruptions in the data set at a later point in time. Furthermore, although the data path into the receiver 809 is shown as flowing through the decoder 811 to the data target 813, it should be appreciated that the present invention is not limited to any particular configuration, as a direct path can alternatively be provided from the communication medium to the data target. Furthermore, it should be appreciated that the present invention is not limited to employing a decoder 811 that always and automatically decodes the data set, as the present invention can be employed with any type of decoder, including one that can be only selectively employed.

Figure 9:
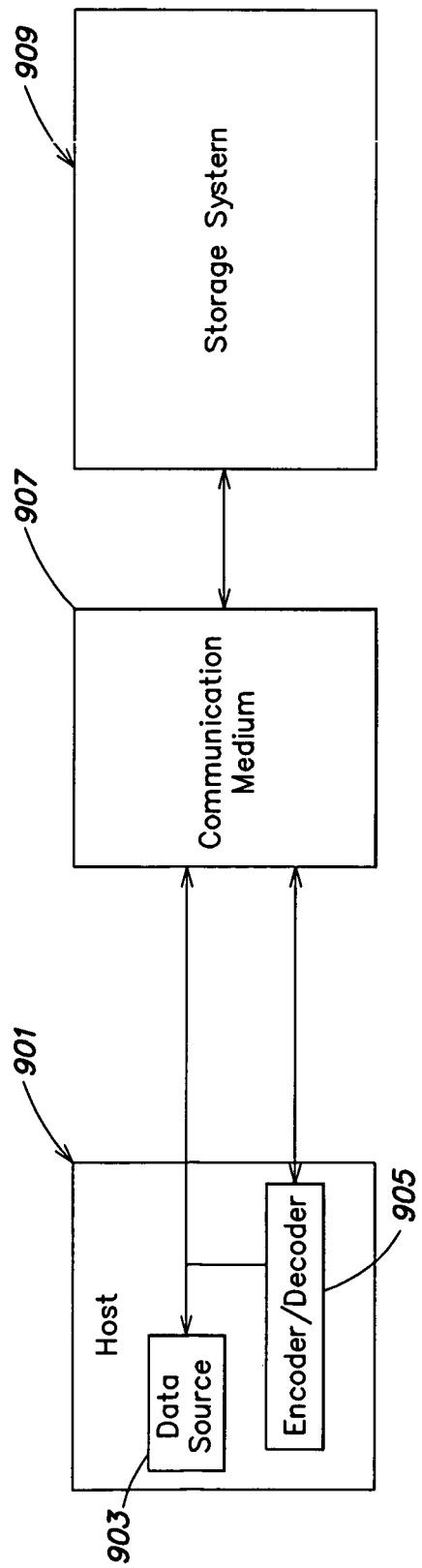
FIG. 9 is a block diagram of a computer system including a storage system on which stored data is protected using an encoder/decoder in accordance with one embodiment of the present invention.

An example system according to another embodiment of the present invention for protecting a stored data set is shown in FIG. 9. The system of FIG. 9 includes a host 901, a storage system 909 and a communication medium 907 that interconnects them. The host 901 includes a data source 903 that can be any type of device that generates or transmits a data set. For example, the host 901 can be any type of computer that is capable of generating a data set, or passing along a data set generated by another device, as the present invention is not limited to use with any particular type of host 901 or data source 903. In addition to the data source 903, the host 901 also includes an encoder/decoder 905. The encoder/decoder 905 performs a function similar to the encoder 805 discussed above in connection with FIG. 8, and can generate a parity set to protect the data set in accordance with any of the embodiments of the present invention discussed above.

In the embodiment of FIG. 9, the data set and parity set are transmitted, through communication medium 907, to the storage system 909, wherein the data set and the parity set are stored. It should be appreciated that the communication medium can be of any suitable type, as the present invention is not limited in this respect. Similarly, storage system 909 can be any type of storage system. For example, storage system 909 can include a single storage box (which may include one or more storage devices within), or it may constitute a relatively large distributed storage system in which data is distributed across multiple boxes (e.g., nodes) in the storage system. The actual storage devices within any of the storage nodes can be any type of storage media, including optical media, magnetic media (e.g., one or more magnetic disks arranged in any fashion, such as a RAID array or magnetic tapes), or any other media. In addition, the storage system 909 may be capable of writing the data and parity set onto one or more transportable storage media, such as a compact disk or a digital video disk, to store information thereon.

In the embodiment of FIG. 9, the host 901 is arranged to not only write the data set to the storage system 909, but also to retrieve the data set there from at a later point in time. It should be appreciated that corruptions in the data set can occur through the communication medium 907, and also through imperfections in the storage system 909 and/or the storage media used thereby. Thus, when corruptions are encountered in the data set when it is retrieved by the host 901 from the storage system 909, the encoder/decoder 905 can decode the corrupted data bits in much the same manner as the decoder 811 discussed above in connection with FIG. 8, and employing any embodiments of the present invention described herein.

In the embodiment shown in FIG. 9, a single encoder/decoder 905 is employed. However, it should be appreciated that the present invention is not limited in this respect, and that separate devices can be employed to perform the encoding and decoding operations. Furthermore, in the illustrated embodiment, the host 901 writes the data set to the storage system 909 and also reads it there from. It should be appreciated that the present invention is not limited in this respect and can be employed to protect a data set that is written to a storage media by one device (e.g., a host) and is read there from by another.

Figure 10:
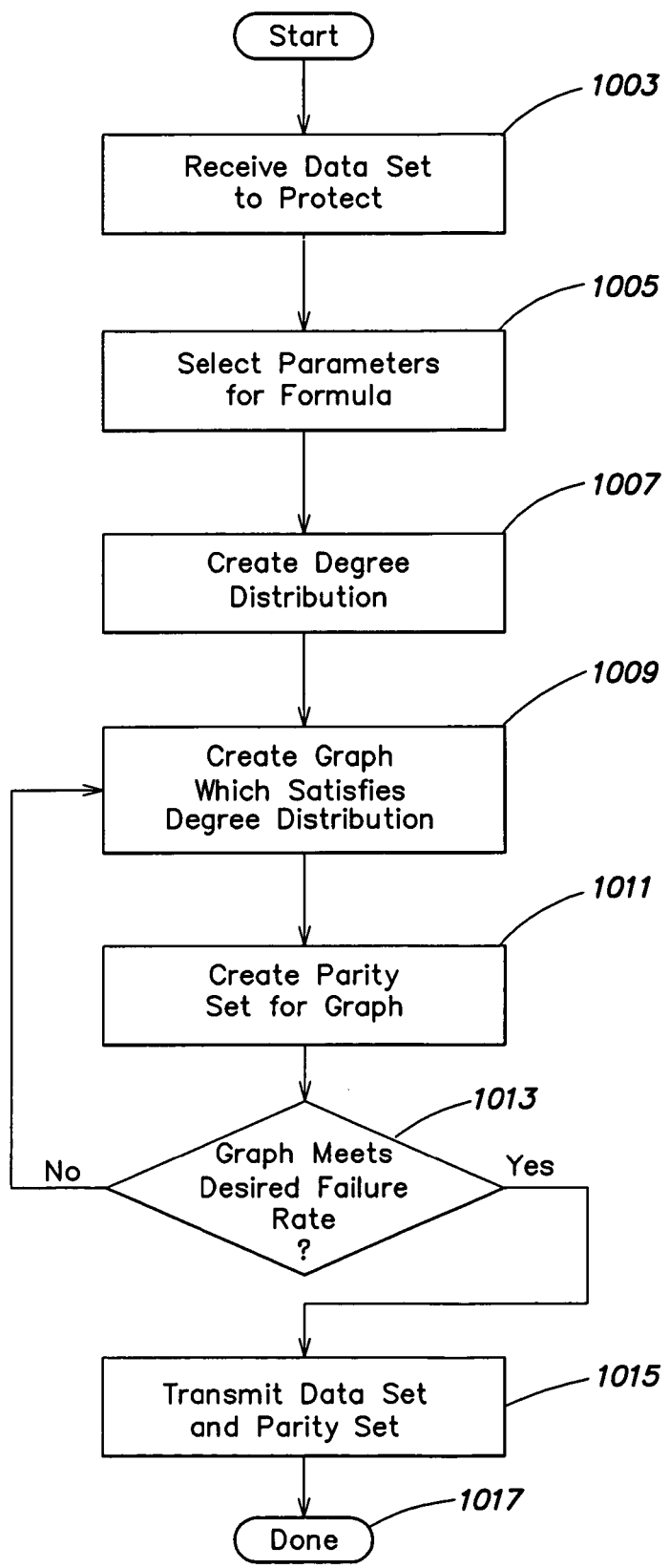
FIG. 10 is a flow chart of a process for creating a particular parity set in accordance with one embodiment of the present invention.

FIG. 10 is a flow chart illustrating a process for encoding a parity set according to one embodiment of the invention. The process begins at act 1003 with receipt of a data set to be protected. At act 1005, parameters for the formula used to define the parity point degree distribution (e.g., the formula of Table 4 discussed above) are selected, and in act 1007 these parameters are used to create a degree distribution. In selecting the parameters, the rate of loss to be protected against within a specified failure rate can be considered as discussed above. A graph which satisfies the degree distribution is created at act 1009, and a parity set corresponding to the data set is created based on the graph (act 1011). At act 1013, it is determined whether the graph meets a desired failure rate for a specified rate of loss, and if not, the process returns to act 1009 to create a different graph. When it is determined in act 1013 that a particular graph meets the desired failure rate, the data set and parity set are transmitted (act 1015) and the encoding process ends.

It should be understood that acts 1005–1009 may be performed before the data set is received. For example, the same graph may be used for many different data sets and a new graph need not be created each time it is desired to encode a data set. Further, it should be appreciated that determining whether the graph meets a desired failure rate (act 1013) may also be performed before the data set is received as sample data sets can be used in act 1013 to test the performance of the graph(s). As discussed above, a graph may be thoroughly tested to determine whether it meets a desired failure rate before it is used in encoding a data set.

It should be appreciated that the process of decoding a corrupted data set involves a determination of the nature of any corruptions in the data set, and then the use of the parity set, along with the data set, to correct the corruptions by restoring erased data bits or correcting erroneous data bits. The decoding process can be performed in any suitable manner, as the present invention is not limited to any particular decoding techniques.

It should be appreciated that decoding processes, whether for error correction or erasure correction, seek to identify data bit corruptions wherein there is only a single bit corrupted in a particular data/parity correspondence, so that the corrupted bit can be corrected or received. By correcting each instance where there is only a single bit of corruption, the data set can be progressively improved. As a result, data set/parity correspondencies that may have had multiple corruptions when the data set was originally received, may, through the correction of some data bits using other data set/parity set correspondencies, be corrected. In this manner, the decoding process can potentially work its way through a correction of all of the corrupted data bits.

Figure 4:
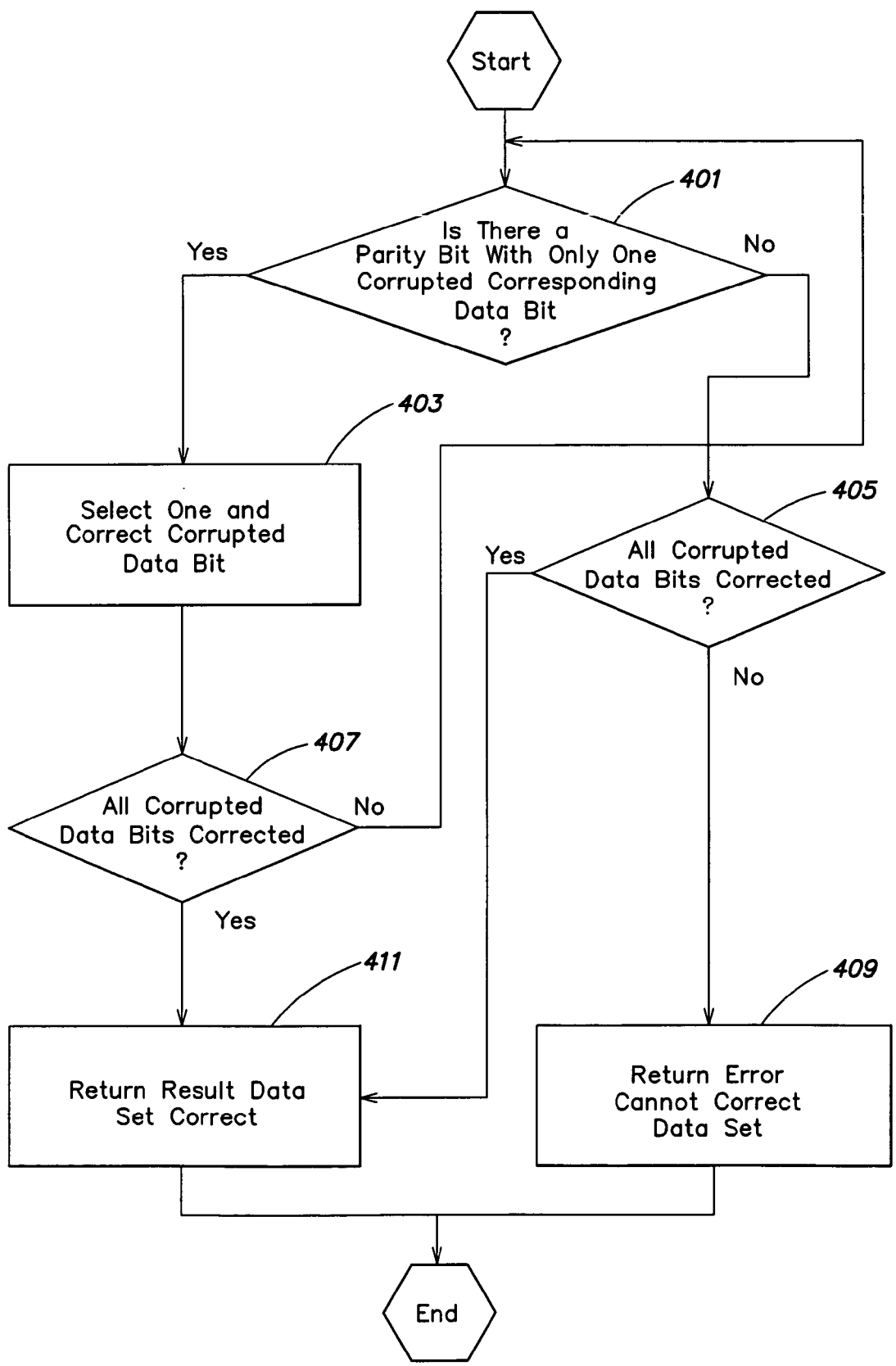
FIG. 4 is a flow chart illustrating an example of a method for decoding a data set according to one embodiment of the invention.

An illustrative process for decoding a data set is illustrated in FIG. 4. As discussed above, this process can be executed by a decoder in systems where a stand-alone decoder is provided, or by an encoder/decoder.

Prior to calling the process of FIG. 4, some information concerning the data set and its corresponding parity set has already been accumulated and stored (e.g., by the decoder in one or more data structures). For example, when protecting a data set against errors, after the data set has been received, the parity set can be generated from the received data set and compared against the expected parity set, to identify any errors. Similarly, when protecting against erasures, bits in the data set that have been erased can be identified. Thus, in each circumstance, the corruptions can be identified prior to calling the process of FIG. 4.

Initially, in act 401, it is determined whether there is a parity bit with only one corrupted corresponding data bit. If so, the process proceeds to act 403, wherein the corrupted data bit is corrected (e.g., by XORing the parity bit and the other corresponding data bits). The process then proceeds to act 407, wherein a determination is made as to whether all of the corrupted data bits have been corrected. If not, the process returns to act 401. In this manner, the process loops through acts 401, 403 and 407 until either a determination is made in act 407 that all of the corrupted data bits have been corrected, or a determination is made in act 401 that no parity bits remain with only one corrupted corresponding data bit.

When it is determined at act 401 that no parity bits remain with only one corresponding corrupted data bit, the process proceeds to act 405, wherein a determination is made as to whether all of the corrupted data bits have been corrected. If not, the process proceeds to act 409, wherein an error is returned indicating that the data set cannot be corrected and the process terminates. Conversely, when it is determined at either of acts 405 or 407 that all of the corrupted data bits have been corrected, the process proceeds to act 411, wherein a result is returned indicating that the data set is correct, and the process terminates.

It should be appreciated that the process of FIG. 4 can be implemented in any of numerous ways, as the present invention is not limited to any particular implementation. In accordance with one embodiment of the present invention wherein the decoding process is performed in software (e.g., by any suitable processor programmed to perform the decoding function), data structures can be created to facilitate the decoding process. An example of data structures that can be created to facilitate correcting erasure corruptions will now be described. It should be appreciated that similar data structures can be created to facilitate correction of error corruptions.

In one embodiment, a first data structure is created that identifies each of the data bits that has been erased, and a second data structure is provided that includes an entry for each parity bit, as well as a corresponding count for that parity bit. When the data structure is initially created, the count for each parity bit is initialized to zero. Thereafter, referring to the first data structure that identifies the erased data bits, each erased data bit is processed and, each of the parity bits that correspond thereto has its parity count incremented by one. After all of the erased data bits have been processed, it should be appreciated that the parity data structure will include a parity count for each parity bit that identifies the number of corresponding data bits that are corrupted. For example, if a particular parity bit corresponds to eight data bits and two of those data bits are corrupted, then the value of the array element associated with that parity bit would be two.

The decoding of the data set can begin by examining the parity data structure to identify any parity count values equal to one, because as discussed above, a function (e.g., XOR) is employed in generating the parity set that can recover from a single bit of corruption. Thus, each parity bit that has a value of one for its parity count entry will correspond to a group of data bits having only a single bit of corruption, so that parity bit can then be used, along with the corresponding data bits, to reconstruct the corrupted data bit (e.g., by XORing the value of the other known data bits and the parity bit). When a data bit is corrected, the data structure corresponding to the data set can be updated to indicate that the data bit is no longer erased. Similarly, the parity data structure can be updated by reducing the parity count entries for any parity bits that are in a data/parity grouping including the newly corrected data bit. For example, if the data bit that was corrected corresponds to four parity bits, the values of the parity count entries associated with each of those four parity bits would be decreased by one. This process is repeated until either all corrupted data bits are corrected, or there are no more parity bits with an associated parity count indicating that the data set is not correctable.

In accordance with one embodiment of the present invention, a log is kept to record the actions taken during the decoding process, such as identifying particular actions taken to correct particular data bits (e.g., identifying which parity bits are used to correct those data bits). The log may prove advantageous in the event of recurring corruptions, wherein the same bits in a data set are repeatedly corrupted. This could occur, for example, in the event of a hardware failure wherein certain bits are repeatedly lost. By using the log to reconstruct the lost data bits, the decoding process can be simplified, and therefore can be implemented more efficiently. Although advantageous and used in accordance with one embodiment of the present invention, it should be appreciated that the use of a log is optional, and is not required in connection with all embodiments of the present invention.

According to another embodiment of the invention, the data structures used to decode a data set may be represented both from data-centric and parity-centric points of view to help increase the speed of the decoding process. FIG. 5A shows a representation of graph 100 of FIG. 1 from a data-centric point of view (i.e., indexed by the data points), while FIG. 5B shows a representation of the same graph from a parity-centric point of view (i.e., indexed by the parity points). As seen in FIG. 5A, for each data point in graph 100, the parity points which correspond to that data point are provided. For example, data point D1 corresponds to parity points P1 and P5 because there are edges between D1 and P1, and D1 and P5. Conversely, in FIG. 5B, for each parity point in graph 100, the data points which correspond to that parity point are provided. For example, parity point P1 corresponds to data point D1, D4, and D7 because there are edges between P1 and D1, P1 and D4, and P1 and D7.

While either of these representations alone suffices to describe graph 100, the speed of the decoding process may be increased by using both. For example, the parity-centric representation may be used when determining if there exists a parity bit with only one corrupted corresponding data bit. That is, suppose that the data bits represented by data points D2 and D4 are corrupted. By using the parity-centric representation shown in FIG. 5B, it is efficient to determine that the parity bits represented by parity points P1 and P2 both have only one corresponding corrupted data bit. Once a data bit has been corrected, it may be desirable to decrement the value of the parity count for the parity bits corresponding to the data bit that was corrected. The data-centric representation of the graph is well-suited for this purpose. For example, suppose the bit represented by data point D4 was corrected using the parity bit corresponding to parity point P1. Looking at the data-centric representation of FIG. 5A, it can efficiently be determined that the values of the parity count fields for the parity bits corresponding to the parity point P4 and P6 should be updated, as well as the parity count field associated with parity point P1.

As discussed above, although both parity-centric and data-centric representations may be used in accordance with one embodiment of the present invention, it should be appreciated that the invention is not limited in this respect, and that alternate embodiments can employ only a single representation of the bipartite graph in the decoding process.

Experimental testing has demonstrated that codes generated in accordance with various embodiments of the present invention perform favorably as compared to other coding techniques.

In one experiment, a 13.1 Megabyte file was separated into blocks of 5040 8-byte data packets, and 1760 8-byte parity packets were added, first using the Luby transform and then using one embodiment of the present invention (referred to as the present code). Next, a random 20% of each block (of data and parity bits) was corrupted and the data bits were decoded. Also, the "concatenated" Reed-Solomon algorithm was tested by applying a Reed-Solomon code to twenty-seven mini-blocks, each consisting of 185 32-byte data packets (using 4-byte symbols and eight symbols per packet) and seventy 32-byte parity packets. In each of these algorithms, it was assumed during decoding that the same bit positions were corrupted in each block of the file. The experiments were done using C implementations of the algorithms on a 1.7 GHz Intel Xeon CPU. Table 9 summarizes the results. As can be seen, the Servi code outperformed both the Luby Transform and the "concatenated" Reed-Solomon algorithm in both encoding speed and decoding speed. Additionally, the failure rate of the Servi code was four orders of magnitude lower than that of the Luby transform and six orders of magnitude lower than that of the "concatenated" Reed-Solomon algorithm.

TABLE 9

| Method | Encode Speed (Mb/sec) | Decode Speed (Mb/sec) | Failure Rate |
|---|---|---|---|
| Luby Transform | 220 | 180 | $6 \times 10^{-3}$ |
| "concatenated" Reed-Solomon | 3 | 11 | $2 \times 10^{-1}$ |
| Servi Code | 240 | 760 | $8 \times 10^{-7}$ |

The above-described embodiments of the present invention can be implemented in any of numerous ways. For example, the above-discussed functionality can be implemented using hardware, software or a combination thereof. When implemented in software, the software code can be executed on any suitable processor (e.g., a microprocessor).

In this respect, it should be appreciated that one implementation of the embodiments of the present invention comprises at least one computer-readable medium (e.g., a computer memory, a floppy disk, a compact disk, a tape, etc.) encoded with a computer program (i.e., a plurality of instructions), which, when executed on a processor, performs the above-discussed functions of the embodiments of the present invention. The computer-readable medium can be transportable such that the program stored thereon can be loaded onto any computer system resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and equivalents thereto.

APPENDIX

| ND | SD | ND | SD | ND | SD | ND | SD | ND | SD | ND | SD | ND | SD | ND | SD | ND | SD | ND | SD | ND | SD |
|---|---|---|---|---|---|---|---|---|---|---|---|---|---|---|---|---|---|---|---|---|---|
| 1 | 0 | 54 | 1 | 107 | 1 | 160 | 0 | 213 | 0 | 266 | 1 | 319 | 0 | 372 | 0 | 425 | 0 | 478 | 0 | 531 | 0 |
| 2 | 0 | 55 | 2 | 108 | 0 | 161 | 1 | 214 | 0 | 267 | 0 | 320 | 0 | 373 | 1 | 426 | 0 | 479 | 0 | 532 | 0 |
| 3 | 0 | 56 | 2 | 109 | 1 | 162 | 0 | 215 | 0 | 268 | 0 | 321 | 0 | 374 | 0 | 427 | 0 | 480 | 0 | 533 | 0 |
| 4 | 0 | 57 | 1 | 110 | 1 | 163 | 0 | 216 | 1 | 269 | 0 | 322 | 0 | 375 | 0 | 428 | 0 | 481 | 0 | 534 | 0 |
| 5 | 0 | 58 | 2 | 111 | 0 | 164 | 1 | 217 | 0 | 270 | 0 | 323 | 0 | 376 | 0 | 429 | 0 | 482 | 0 | 535 | 0 |
| 6 | 0 | 59 | 2 | 112 | 1 | 165 | 0 | 218 | 0 | 271 | 1 | 324 | 1 | 377 | 0 | 430 | 1 | 483 | 0 | 536 | 0 |
| 7 | 0 | 60 | 1 | 113 | 0 | 166 | 0 | 219 | 0 | 272 | 0 | 325 | 0 | 378 | 0 | 431 | 0 | 484 | 0 | 537 | 0 |
| 8 | 0 | 61 | 1 | 114 | 1 | 167 | 1 | 220 | 1 | 273 | 0 | 326 | 0 | 379 | 0 | 432 | 0 | 485 | 0 | 538 | 0 |
| 9 | 0 | 62 | 2 | 115 | 0 | 168 | 0 | 221 | 0 | 274 | 0 | 327 | 0 | 380 | 1 | 433 | 0 | 486 | 0 | 539 | 0 |
| 10 | 0 | 63 | 1 | 116 | 1 | 169 | 0 | 222 | 0 | 275 | 0 | 328 | 0 | 381 | 0 | 434 | 0 | 487 | 1 | 540 | 0 |
| 11 | 0 | 64 | 1 | 117 | 1 | 170 | 1 | 223 | 0 | 276 | 1 | 329 | 0 | 382 | 0 | 435 | 0 | 488 | 0 | 541 | 1 |
| 12 | 742 | 65 | 2 | 118 | 0 | 171 | 0 | 224 | 1 | 277 | 0 | 330 | 1 | 383 | 0 | 436 | 0 | 489 | 0 | 542 | 0 |
| 13 | 255 | 66 | 1 | 119 | 1 | 172 | 0 | 225 | 0 | 278 | 0 | 331 | 0 | 384 | 0 | 437 | 0 | 490 | 0 | 543 | 0 |
| 14 | 131 | 67 | 1 | 120 | 0 | 173 | 1 | 226 | 0 | 279 | 0 | 332 | 0 | 385 | 0 | 438 | 0 | 491 | 0 | 544 | 0 |
| 15 | 81 | 68 | 1 | 121 | 1 | 174 | 0 | 227 | 0 | 280 | 0 | 333 | 0 | 386 | 0 | 439 | 1 | 492 | 0 | 545 | 0 |
| 16 | 55 | 69 | 2 | 122 | 0 | 175 | 0 | 228 | 1 | 281 | 0 | 334 | 0 | 387 | 0 | 440 | 0 | 493 | 0 | 546 | 0 |
| 17 | 41 | 70 | 1 | 123 | 1 | 176 | 1 | 229 | 0 | 282 | 1 | 335 | 0 | 388 | 1 | 441 | 0 | 494 | 0 | 547 | 0 |
| 18 | 31 | 71 | 1 | 124 | 0 | 177 | 0 | 230 | 0 | 283 | 0 | 336 | 0 | 389 | 0 | 442 | 0 | 495 | 0 | 548 | 0 |
| 19 | 25 | 72 | 1 | 125 | 1 | 178 | 0 | 231 | 0 | 284 | 0 | 337 | 1 | 390 | 0 | 443 | 0 | 496 | 0 | 549 | 0 |
| 20 | 21 | 73 | 1 | 126 | 0 | 179 | 1 | 232 | 1 | 285 | 0 | 338 | 0 | 391 | 0 | 444 | 0 | 497 | 1 | 550 | 0 |
| 21 | 17 | 74 | 1 | 127 | 1 | 180 | 0 | 233 | 0 | 286 | 0 | 339 | 0 | 392 | 0 | 445 | 0 | 498 | 0 | 551 | 0 |
| 22 | 14 | 75 | 1 | 128 | 0 | 181 | 0 | 234 | 0 | 287 | 1 | 340 | 0 | 393 | 0 | 446 | 0 | 499 | 0 | 552 | 1 |
| 23 | 13 | 76 | 1 | 129 | 1 | 182 | 0 | 235 | 0 | 288 | 0 | 341 | 0 | 394 | 0 | 447 | 0 | 500 | 0 | 553 | 0 |
| 24 | 11 | 77 | 1 | 130 | 0 | 183 | 1 | 236 | 0 | 289 | 0 | 342 | 0 | 395 | 0 | 448 | 1 | 501 | 0 | 554 | 0 |
| 25 | 10 | 78 | 1 | 131 | 0 | 184 | 0 | 237 | 1 | 290 | 0 | 343 | 0 | 396 | 1 | 449 | 0 | 502 | 0 | 555 | 0 |
| 26 | 9 | 79 | 1 | 132 | 1 | 185 | 0 | 238 | 0 | 291 | 0 | 344 | 1 | 397 | 0 | 450 | 0 | 503 | 0 | 556 | 0 |
| 27 | 7 | 80 | 1 | 133 | 0 | 186 | 1 | 239 | 0 | 292 | 0 | 345 | 0 | 398 | 0 | 451 | 0 | 504 | 0 | 557 | 0 |
| 28 | 8 | 81 | 1 | 134 | 1 | 187 | 0 | 240 | 0 | 293 | 1 | 346 | 0 | 399 | 0 | 452 | 0 | 505 | 0 | 558 | 0 |
| 29 | 6 | 82 | 1 | 135 | 0 | 188 | 0 | 241 | 1 | 294 | 0 | 347 | 0 | 400 | 0 | 453 | 0 | 506 | 0 | 559 | 0 |
| 30 | 6 | 83 | 1 | 136 | 1 | 189 | 1 | 242 | 0 | 295 | 0 | 348 | 0 | 401 | 0 | 454 | 0 | 507 | 0 | 560 | 0 |
| 31 | 6 | 84 | 0 | 137 | 0 | 190 | 0 | 243 | 0 | 296 | 0 | 349 | 0 | 402 | 0 | 455 | 0 | 508 | 1 | 561 | 0 |
| 32 | 5 | 85 | 1 | 138 | 1 | 191 | 0 | 244 | 0 | 297 | 0 | 350 | 0 | 403 | 0 | 456 | 0 | 509 | 0 | 562 | 0 |

APPENDIX-continued

| | | | | | | | | | | | | | | | | | | | |
|---|---|---|---|---|---|---|---|---|---|---|---|---|---|---|---|---|---|---|---|
| 33 | 4 | 86 | 1 | 139 | 0 | 192 | 0 | 245 | 0 | 298 | 0 | 351 | 1 | 404 | 1 | 457 | 1 | 510 | 0 | 563 | 0 |
| 34 | 5 | 87 | 1 | 140 | 0 | 193 | 1 | 246 | 1 | 299 | 1 | 352 | 0 | 405 | 0 | 458 | 0 | 511 | 0 | 564 | 1 |
| 35 | 4 | 88 | 1 | 141 | 1 | 194 | 0 | 247 | 0 | 300 | 0 | 353 | 0 | 406 | 0 | 459 | 0 | 512 | 0 | 565 | 0 |
| 36 | 4 | 89 | 1 | 142 | 0 | 195 | 0 | 248 | 0 | 301 | 0 | 354 | 0 | 407 | 0 | 460 | 0 | 513 | 0 | 566 | 0 |
| 37 | 4 | 90 | 0 | 143 | 1 | 196 | 0 | 249 | 0 | 302 | 0 | 355 | 0 | 408 | 0 | 461 | 0 | 514 | 0 | 567 | 0 |
| 38 | 3 | 91 | 1 | 144 | 0 | 197 | 1 | 250 | 0 | 303 | 0 | 356 | 0 | 409 | 0 | 462 | 0 | 515 | 0 | 568 | 0 |
| 39 | 3 | 92 | 1 | 145 | 1 | 198 | 0 | 251 | 1 | 304 | 0 | 357 | 0 | 410 | 0 | 463 | 0 | 516 | 0 | 569 | 0 |
| 40 | 4 | 93 | 1 | 146 | 0 | 199 | 0 | 252 | 0 | 305 | 1 | 358 | 1 | 411 | 0 | 464 | 0 | 517 | 0 | 570 | 0 |
| 41 | 3 | 94 | 0 | 147 | 0 | 200 | 1 | 253 | 0 | 306 | 0 | 359 | 0 | 412 | 0 | 465 | 0 | 518 | 1 | 571 | 0 |
| 42 | 2 | 95 | 1 | 148 | 1 | 201 | 0 | 254 | 0 | 307 | 0 | 360 | 0 | 413 | 1 | 466 | 0 | 519 | 0 | 572 | 0 |
| 43 | 3 | 96 | 1 | 149 | 0 | 202 | 0 | 255 | 0 | 308 | 0 | 361 | 0 | 414 | 0 | 467 | 1 | 520 | 0 | 573 | 0 |
| 44 | 3 | 97 | 0 | 150 | 0 | 203 | 0 | 256 | 1 | 309 | 0 | 362 | 0 | 415 | 0 | 468 | 0 | 521 | 0 | 574 | 0 |
| 45 | 2 | 98 | 1 | 151 | 1 | 204 | 1 | 257 | 0 | 310 | 0 | 363 | 0 | 416 | 0 | 469 | 0 | 522 | 0 | 575 | 0 |
| 46 | 2 | 99 | 1 | 152 | 0 | 205 | 0 | 258 | 0 | 311 | 1 | 364 | 0 | 417 | 0 | 470 | 0 | 523 | 0 | 576 | 1 |
| 47 | 3 | 100 | 0 | 153 | 1 | 206 | 0 | 259 | 0 | 312 | 0 | 365 | 1 | 418 | 0 | 471 | 0 | 524 | 0 | 577 | 0 |
| 48 | 2 | 101 | 2 | 154 | 0 | 207 | 0 | 260 | 0 | 313 | 0 | 366 | 0 | 419 | 0 | 472 | 0 | 525 | 0 | 578 | 0 |
| 49 | 2 | 102 | 1 | 155 | 0 | 208 | 1 | 261 | 1 | 314 | 0 | 367 | 0 | 420 | 0 | 473 | 0 | 526 | 0 | 579 | 0 |
| 50 | 2 | 103 | 0 | 156 | 1 | 209 | 0 | 262 | 0 | 315 | 0 | 368 | 0 | 421 | 1 | 474 | 0 | 527 | 0 | 580 | 0 |
| 51 | 2 | 104 | 1 | 157 | 0 | 210 | 0 | 263 | 0 | 316 | 0 | 369 | 0 | 422 | 0 | 475 | 0 | 528 | 0 | 581 | 0 |
| 52 | 2 | 105 | 1 | 158 | 0 | 211 | 0 | 264 | 0 | 317 | 1 | 370 | 0 | 423 | 0 | 476 | 0 | 529 | 1 | 582 | 0 |
| 53 | 2 | 106 | 0 | 159 | 1 | 212 | 1 | 265 | 0 | 318 | 0 | 371 | 0 | 424 | 0 | 477 | 1 | 530 | 0 | 583 | 0 |

| ND | SD | ND | SD | ND | SD | ND | SD | ND | SD | ND | SD | ND | SD | ND | SD | ND | SD | ND | SD | ND | SD |
|---|---|---|---|---|---|---|---|---|---|---|---|---|---|---|---|---|---|---|---|---|---|
| 584 | 0 | 637 | 0 | 690 | 0 | 743 | 0 | 796 | 0 | 849 | 0 | 902 | 0 | 955 | 0 | 1008 | 0 | 1061 | 0 | 1114 | 0 |
| 585 | 0 | 638 | 0 | 691 | 0 | 744 | 1 | 797 | 0 | 850 | 0 | 903 | 1 | 956 | 0 | 1009 | 0 | 1062 | 0 | 1115 | 0 |
| 586 | 0 | 639 | 0 | 692 | 0 | 745 | 0 | 798 | 0 | 851 | 0 | 904 | 0 | 957 | 0 | 1010 | 0 | 1063 | 0 | 1116 | 0 |
| 587 | 0 | 640 | 1 | 693 | 0 | 746 | 0 | 799 | 0 | 852 | 0 | 905 | 0 | 958 | 0 | 1011 | 0 | 1064 | 0 | 1117 | 0 |
| 588 | 1 | 641 | 0 | 694 | 0 | 747 | 0 | 800 | 0 | 853 | 0 | 906 | 0 | 959 | 0 | 1012 | 0 | 1065 | 0 | 1118 | 0 |
| 589 | 0 | 642 | 0 | 695 | 0 | 748 | 0 | 801 | 0 | 854 | 0 | 907 | 0 | 960 | 0 | 1013 | 0 | 1066 | 0 | 1119 | 0 |
| 590 | 0 | 643 | 0 | 696 | 0 | 749 | 0 | 802 | 0 | 855 | 0 | 908 | 0 | 961 | 0 | 1014 | 0 | 1067 | 0 | 1120 | 0 |
| 591 | 0 | 644 | 0 | 697 | 1 | 750 | 0 | 803 | 0 | 856 | 0 | 909 | 0 | 962 | 0 | 1015 | 0 | 1068 | 0 | 1121 | 0 |
| 592 | 0 | 645 | 0 | 698 | 0 | 751 | 0 | 804 | 0 | 857 | 0 | 910 | 0 | 963 | 0 | 1016 | 0 | 1069 | 0 | 1122 | 0 |
| 593 | 0 | 646 | 0 | 699 | 0 | 752 | 0 | 805 | 0 | 858 | 0 | 911 | 0 | 964 | 1 | 1017 | 0 | 1070 | 0 | 1123 | 1 |
| 594 | 0 | 647 | 0 | 700 | 0 | 753 | 0 | 806 | 0 | 859 | 0 | 912 | 0 | 965 | 0 | 1018 | 0 | 1071 | 0 | 1124 | 0 |
| 595 | 0 | 648 | 0 | 701 | 0 | 754 | 0 | 807 | 0 | 860 | 0 | 913 | 0 | 966 | 0 | 1019 | 0 | 1072 | 0 | 1125 | 0 |
| 596 | 0 | 649 | 0 | 702 | 0 | 755 | 0 | 808 | 0 | 861 | 0 | 914 | 0 | 967 | 0 | 1020 | 0 | 1073 | 0 | 1126 | 0 |
| 597 | 0 | 650 | 0 | 703 | 0 | 756 | 0 | 809 | 0 | 862 | 0 | 915 | 0 | 968 | 0 | 1021 | 0 | 1074 | 0 | 1127 | 0 |
| 598 | 0 | 651 | 0 | 704 | 0 | 757 | 0 | 810 | 1 | 863 | 0 | 916 | 0 | 969 | 0 | 1022 | 0 | 1075 | 1 | 1128 | 0 |
| 599 | 0 | 652 | 0 | 705 | 0 | 758 | 0 | 811 | 0 | 864 | 0 | 917 | 0 | 970 | 0 | 1023 | 0 | 1076 | 0 | 1129 | 0 |
| 600 | 0 | 653 | 0 | 706 | 0 | 759 | 0 | 812 | 0 | 865 | 1 | 918 | 0 | 971 | 0 | 1024 | 0 | 1077 | 0 | 1130 | 0 |
| 601 | 1 | 654 | 1 | 707 | 0 | 760 | 1 | 813 | 0 | 866 | 0 | 919 | 0 | 972 | 0 | 1025 | 0 | 1078 | 0 | 1131 | 0 |
| 602 | 0 | 655 | 0 | 708 | 0 | 761 | 0 | 814 | 0 | 867 | 0 | 920 | 0 | 973 | 0 | 1026 | 0 | 1079 | 0 | 1132 | 0 |
| 603 | 0 | 656 | 0 | 709 | 0 | 762 | 0 | 815 | 0 | 868 | 0 | 921 | 0 | 974 | 0 | 1027 | 0 | 1080 | 0 | 1133 | 0 |
| 604 | 0 | 657 | 0 | 710 | 0 | 763 | 0 | 816 | 0 | 869 | 0 | 922 | 0 | 975 | 0 | 1028 | 0 | 1081 | 0 | 1134 | 0 |
| 605 | 0 | 658 | 0 | 711 | 0 | 764 | 0 | 817 | 0 | 870 | 0 | 923 | 1 | 976 | 0 | 1029 | 1 | 1082 | 0 | 1135 | 0 |
| 606 | 0 | 659 | 0 | 712 | 1 | 765 | 0 | 818 | 0 | 871 | 0 | 924 | 0 | 977 | 0 | 1030 | 0 | 1083 | 0 | 1136 | 0 |
| 607 | 0 | 660 | 0 | 713 | 0 | 766 | 0 | 819 | 0 | 872 | 0 | 925 | 0 | 978 | 0 | 1031 | 0 | 1084 | 0 | 1137 | 0 |
| 608 | 0 | 661 | 0 | 714 | 0 | 767 | 0 | 820 | 0 | 873 | 0 | 926 | 0 | 979 | 0 | 1032 | 0 | 1085 | 0 | 1138 | 0 |
| 609 | 0 | 662 | 0 | 715 | 0 | 768 | 0 | 821 | 0 | 874 | 0 | 927 | 0 | 980 | 0 | 1033 | 0 | 1086 | 0 | 1139 | 0 |
| 610 | 0 | 663 | 0 | 716 | 0 | 769 | 0 | 822 | 0 | 875 | 0 | 928 | 0 | 981 | 0 | 1034 | 0 | 1087 | 0 | 1140 | 0 |
| 611 | 0 | 664 | 0 | 717 | 0 | 770 | 0 | 823 | 0 | 876 | 0 | 929 | 0 | 982 | 0 | 1035 | 0 | 1088 | 0 | 1141 | 0 |
| 612 | 0 | 665 | 0 | 718 | 0 | 771 | 0 | 824 | 0 | 877 | 0 | 930 | 0 | 983 | 0 | 1036 | 0 | 1089 | 0 | 1142 | 0 |
| 613 | 0 | 666 | 0 | 719 | 0 | 772 | 0 | 825 | 0 | 878 | 0 | 931 | 0 | 984 | 0 | 1037 | 0 | 1090 | 0 | 1143 | 0 |
| 614 | 1 | 667 | 0 | 720 | 0 | 773 | 0 | 826 | 0 | 879 | 0 | 932 | 0 | 985 | 1 | 1038 | 0 | 1091 | 0 | 1144 | 0 |
| 615 | 0 | 668 | 1 | 721 | 0 | 774 | 0 | 827 | 0 | 880 | 0 | 933 | 0 | 986 | 0 | 1039 | 0 | 1092 | 0 | 1145 | 0 |
| 616 | 0 | 669 | 0 | 722 | 0 | 775 | 0 | 828 | 1 | 881 | 0 | 934 | 0 | 987 | 0 | 1040 | 0 | 1093 | 0 | 1146 | 0 |
| 617 | 0 | 670 | 0 | 723 | 0 | 776 | 1 | 829 | 0 | 882 | 0 | 935 | 0 | 988 | 0 | 1041 | 0 | 1094 | 0 | 1147 | 0 |
| 618 | 0 | 671 | 0 | 724 | 0 | 777 | 0 | 830 | 0 | 883 | 0 | 936 | 0 | 989 | 0 | 1042 | 0 | 1095 | 0 | 1148 | 1 |
| 619 | 0 | 672 | 0 | 725 | 0 | 778 | 0 | 831 | 0 | 884 | 1 | 937 | 0 | 990 | 0 | 1043 | 0 | 1096 | 0 | 1149 | 0 |
| 620 | 0 | 673 | 0 | 726 | 0 | 779 | 0 | 832 | 0 | 885 | 0 | 938 | 0 | 991 | 0 | 1044 | 0 | 1097 | 0 | 1150 | 0 |
| 621 | 0 | 674 | 0 | 727 | 0 | 780 | 0 | 833 | 0 | 886 | 0 | 939 | 0 | 992 | 0 | 1045 | 0 | 1098 | 0 | 1151 | 0 |
| 622 | 0 | 675 | 0 | 728 | 1 | 781 | 0 | 834 | 0 | 887 | 0 | 940 | 0 | 993 | 0 | 1046 | 0 | 1099 | 1 | 1152 | 0 |
| 623 | 0 | 676 | 0 | 729 | 0 | 782 | 0 | 835 | 0 | 888 | 0 | 941 | 0 | 994 | 0 | 1047 | 0 | 1100 | 0 | 1153 | 0 |
| 624 | 0 | 677 | 0 | 730 | 0 | 783 | 0 | 836 | 0 | 889 | 0 | 942 | 0 | 995 | 0 | 1048 | 0 | 1101 | 0 | 1154 | 0 |
| 625 | 0 | 678 | 0 | 731 | 0 | 784 | 0 | 837 | 0 | 890 | 0 | 943 | 1 | 996 | 0 | 1049 | 0 | 1102 | 0 | 1155 | 0 |
| 626 | 0 | 679 | 0 | 732 | 0 | 785 | 0 | 838 | 0 | 891 | 0 | 944 | 0 | 997 | 0 | 1050 | 0 | 1103 | 0 | 1156 | 0 |
| 627 | 1 | 680 | 0 | 733 | 0 | 786 | 0 | 839 | 0 | 892 | 0 | 945 | 0 | 998 | 0 | 1051 | 0 | 1104 | 0 | 1157 | 0 |
| 628 | 0 | 681 | 0 | 734 | 0 | 787 | 0 | 840 | 0 | 893 | 0 | 946 | 0 | 999 | 0 | 1052 | 1 | 1105 | 0 | 1158 | 0 |
| 629 | 0 | 682 | 1 | 735 | 0 | 788 | 0 | 841 | 0 | 894 | 0 | 947 | 0 | 1000 | 0 | 1053 | 0 | 1106 | 0 | 1159 | 0 |
| 630 | 0 | 683 | 0 | 736 | 0 | 789 | 0 | 842 | 0 | 895 | 0 | 948 | 0 | 1001 | 0 | 1054 | 0 | 1107 | 0 | 1160 | 0 |
| 631 | 0 | 684 | 0 | 737 | 0 | 790 | 0 | 843 | 0 | 896 | 0 | 949 | 0 | 1002 | 0 | 1055 | 0 | 1108 | 0 | 1161 | 0 |
| 632 | 0 | 685 | 0 | 738 | 0 | 791 | 0 | 844 | 0 | 897 | 0 | 950 | 0 | 1003 | 0 | 1056 | 0 | 1109 | 0 | 1162 | 0 |
| 633 | 0 | 686 | 0 | 739 | 0 | 792 | 0 | 845 | 0 | 898 | 0 | 951 | 0 | 1004 | 0 | 1057 | 0 | 1110 | 0 | 1163 | 0 |
| 634 | 0 | 687 | 0 | 740 | 0 | 793 | 1 | 846 | 1 | 899 | 0 | 952 | 0 | 1005 | 0 | 1058 | 0 | 1111 | 0 | 1164 | 0 |
| 635 | 0 | 688 | 0 | 741 | 0 | 794 | 0 | 847 | 0 | 900 | 0 | 953 | 0 | 1006 | 0 | 1059 | 0 | 1112 | 0 | 1165 | 0 |
| 636 | 0 | 689 | 0 | 742 | 0 | 795 | 0 | 848 | 0 | 901 | 0 | 954 | 0 | 1007 | 1 | 1060 | 0 | 1113 | 0 | 1166 | 0 |

APPENDIX-continued

| ND | SD | ND | SD | ND | SD | ND | SD | ND | SD | ND | SD | ND | SD | ND | SD | ND | SD | ND | SD | ND | SD |
|---|---|---|---|---|---|---|---|---|---|---|---|---|---|---|---|---|---|---|---|---|---|
| 1167 | 0 | 1220 | 0 | 1273 | 0 | 1326 | 0 | 1379 | 0 | 1432 | 0 | 1485 | 0 | 1538 | 0 | 1591 | 0 | 1644 | 0 | 1697 | 0 |
| 1168 | 0 | 1221 | 0 | 1274 | 0 | 1327 | 0 | 1380 | 0 | 1433 | 0 | 1486 | 0 | 1539 | 0 | 1592 | 0 | 1645 | 0 | 1698 | 0 |
| 1169 | 0 | 1222 | 0 | 1275 | 0 | 1328 | 0 | 1381 | 0 | 1434 | 0 | 1487 | 0 | 1540 | 0 | 1593 | 0 | 1646 | 0 | 1699 | 0 |
| 1170 | 0 | 1223 | 0 | 1276 | 0 | 1329 | 0 | 1382 | 0 | 1435 | 0 | 1488 | 0 | 1541 | 0 | 1594 | 0 | 1647 | 0 | 1700 | 0 |
| 1171 | 0 | 1224 | 0 | 1277 | 0 | 1330 | 0 | 1383 | 0 | 1436 | 0 | 1489 | 0 | 1542 | 0 | 1595 | 0 | 1648 | 0 | 1701 | 0 |
| 1172 | 0 | 1225 | 0 | 1278 | 0 | 1331 | 0 | 1384 | 0 | 1437 | 0 | 1490 | 0 | 1543 | 0 | 1596 | 0 | 1649 | 0 | 1702 | 0 |
| 1173 | 1 | 1226 | 1 | 1279 | 0 | 1332 | 0 | 1385 | 0 | 1438 | 0 | 1491 | 0 | 1544 | 0 | 1597 | 1 | 1650 | 0 | 1703 | 0 |
| 1174 | 0 | 1227 | 0 | 1280 | 0 | 1333 | 0 | 1386 | 0 | 1439 | 0 | 1492 | 0 | 1545 | 0 | 1598 | 0 | 1651 | 0 | 1704 | 0 |
| 1175 | 0 | 1228 | 0 | 1281 | 1 | 1334 | 0 | 1387 | 0 | 1440 | 0 | 1493 | 0 | 1546 | 0 | 1599 | 0 | 1652 | 0 | 1705 | 0 |
| 1176 | 0 | 1229 | 0 | 1282 | 0 | 1335 | 0 | 1388 | 0 | 1441 | 0 | 1494 | 0 | 1547 | 0 | 1600 | 0 | 1653 | 0 | 1706 | 0 |
| 1177 | 0 | 1230 | 0 | 1283 | 0 | 1336 | 0 | 1389 | 0 | 1442 | 0 | 1495 | 1 | 1548 | 0 | 1601 | 0 | 1654 | 0 | 1707 | 1 |
| 1178 | 0 | 1231 | 0 | 1284 | 0 | 1337 | 0 | 1390 | 0 | 1443 | 0 | 1496 | 0 | 1549 | 0 | 1602 | 0 | 1655 | 0 | 1708 | 0 |
| 1179 | 0 | 1232 | 0 | 1285 | 0 | 1338 | 0 | 1391 | 0 | 1444 | 0 | 1497 | 0 | 1550 | 0 | 1603 | 0 | 1656 | 0 | 1709 | 0 |
| 1180 | 0 | 1233 | 0 | 1286 | 0 | 1339 | 1 | 1392 | 0 | 1445 | 0 | 1498 | 0 | 1551 | 0 | 1604 | 0 | 1657 | 0 | 1710 | 0 |
| 1181 | 0 | 1234 | 0 | 1287 | 0 | 1340 | 0 | 1393 | 0 | 1446 | 0 | 1499 | 0 | 1552 | 0 | 1605 | 0 | 1658 | 0 | 1711 | 0 |
| 1182 | 0 | 1235 | 0 | 1288 | 0 | 1341 | 0 | 1394 | 0 | 1447 | 0 | 1500 | 0 | 1553 | 0 | 1606 | 0 | 1659 | 0 | 1712 | 0 |
| 1183 | 0 | 1236 | 0 | 1289 | 0 | 1342 | 0 | 1395 | 0 | 1448 | 0 | 1501 | 0 | 1554 | 0 | 1607 | 0 | 1660 | 0 | 1713 | 0 |
| 1184 | 0 | 1237 | 0 | 1290 | 0 | 1343 | 0 | 1396 | 0 | 1449 | 0 | 1502 | 0 | 1555 | 0 | 1608 | 0 | 1661 | 0 | 1714 | 0 |
| 1185 | 0 | 1238 | 0 | 1291 | 0 | 1344 | 0 | 1397 | 0 | 1450 | 0 | 1503 | 0 | 1556 | 0 | 1609 | 0 | 1662 | 0 | 1715 | 0 |
| 1186 | 0 | 1239 | 0 | 1292 | 0 | 1345 | 0 | 1398 | 0 | 1451 | 0 | 1504 | 0 | 1557 | 0 | 1610 | 0 | 1663 | 0 | 1716 | 0 |
| 1187 | 0 | 1240 | 0 | 1293 | 0 | 1346 | 0 | 1399 | 1 | 1452 | 0 | 1505 | 0 | 1558 | 0 | 1611 | 0 | 1664 | 0 | 1717 | 0 |
| 1188 | 0 | 1241 | 0 | 1294 | 0 | 1347 | 0 | 1400 | 0 | 1453 | 0 | 1506 | 0 | 1559 | 0 | 1612 | 0 | 1665 | 0 | 1718 | 0 |
| 1189 | 0 | 1242 | 0 | 1295 | 0 | 1348 | 0 | 1401 | 0 | 1454 | 0 | 1507 | 0 | 1560 | 0 | 1613 | 0 | 1666 | 0 | 1719 | 0 |
| 1190 | 0 | 1243 | 0 | 1296 | 0 | 1349 | 0 | 1402 | 0 | 1455 | 0 | 1508 | 0 | 1561 | 0 | 1614 | 0 | 1667 | 0 | 1720 | 0 |
| 1191 | 0 | 1244 | 0 | 1297 | 0 | 1350 | 0 | 1403 | 0 | 1456 | 0 | 1509 | 0 | 1562 | 1 | 1615 | 0 | 1668 | 0 | 1721 | 0 |
| 1192 | 0 | 1245 | 0 | 1298 | 0 | 1351 | 0 | 1404 | 0 | 1457 | 0 | 1510 | 0 | 1563 | 0 | 1616 | 0 | 1669 | 0 | 1722 | 0 |
| 1193 | 0 | 1246 | 0 | 1299 | 0 | 1352 | 0 | 1405 | 0 | 1458 | 0 | 1511 | 0 | 1564 | 0 | 1617 | 0 | 1670 | 1 | 1723 | 0 |
| 1194 | 0 | 1247 | 0 | 1300 | 0 | 1353 | 0 | 1406 | 0 | 1459 | 0 | 1512 | 0 | 1565 | 0 | 1618 | 0 | 1671 | 0 | 1724 | 0 |
| 1195 | 0 | 1248 | 0 | 1301 | 0 | 1354 | 0 | 1407 | 0 | 1460 | 0 | 1513 | 0 | 1566 | 0 | 1619 | 0 | 1672 | 0 | 1725 | 0 |
| 1196 | 0 | 1249 | 0 | 1302 | 0 | 1355 | 0 | 1408 | 0 | 1461 | 0 | 1514 | 0 | 1567 | 0 | 1620 | 0 | 1673 | 0 | 1726 | 0 |
| 1197 | 0 | 1250 | 0 | 1303 | 0 | 1356 | 0 | 1409 | 0 | 1462 | 1 | 1515 | 0 | 1568 | 0 | 1621 | 0 | 1674 | 0 | 1727 | 0 |
| 1198 | 0 | 1251 | 0 | 1304 | 0 | 1357 | 0 | 1410 | 0 | 1463 | 0 | 1516 | 0 | 1569 | 0 | 1622 | 0 | 1675 | 0 | 1728 | 0 |
| 1199 | 1 | 1252 | 0 | 1305 | 0 | 1358 | 0 | 1411 | 0 | 1464 | 0 | 1517 | 0 | 1570 | 0 | 1623 | 0 | 1676 | 0 | 1729 | 0 |
| 1200 | 0 | 1253 | 1 | 1306 | 0 | 1359 | 0 | 1412 | 0 | 1465 | 0 | 1518 | 0 | 1571 | 0 | 1624 | 0 | 1677 | 0 | 1730 | 0 |
| 1201 | 0 | 1254 | 0 | 1307 | 0 | 1360 | 0 | 1413 | 0 | 1466 | 0 | 1519 | 0 | 1572 | 0 | 1625 | 0 | 1678 | 0 | 1731 | 0 |
| 1202 | 0 | 1255 | 0 | 1308 | 0 | 1361 | 0 | 1414 | 0 | 1467 | 0 | 1520 | 0 | 1573 | 0 | 1626 | 0 | 1679 | 0 | 1732 | 0 |
| 1203 | 0 | 1256 | 0 | 1309 | 1 | 1362 | 0 | 1415 | 0 | 1468 | 0 | 1521 | 0 | 1574 | 0 | 1627 | 0 | 1680 | 0 | 1733 | 0 |
| 1204 | 0 | 1257 | 0 | 1310 | 0 | 1363 | 0 | 1416 | 0 | 1469 | 0 | 1522 | 0 | 1575 | 0 | 1628 | 0 | 1681 | 0 | 1734 | 0 |
| 1205 | 0 | 1258 | 0 | 1311 | 0 | 1364 | 0 | 1417 | 0 | 1470 | 0 | 1523 | 0 | 1576 | 0 | 1629 | 0 | 1682 | 0 | 1735 | 0 |
| 1206 | 0 | 1259 | 0 | 1312 | 0 | 1365 | 0 | 1418 | 0 | 1471 | 0 | 1524 | 0 | 1577 | 0 | 1630 | 0 | 1683 | 0 | 1736 | 0 |
| 1207 | 0 | 1260 | 0 | 1313 | 0 | 1366 | 0 | 1419 | 0 | 1472 | 0 | 1525 | 0 | 1578 | 0 | 1631 | 0 | 1684 | 0 | 1737 | 0 |
| 1208 | 0 | 1261 | 0 | 1314 | 0 | 1367 | 0 | 1420 | 0 | 1473 | 0 | 1526 | 0 | 1579 | 0 | 1632 | 0 | 1685 | 0 | 1738 | 0 |
| 1209 | 0 | 1262 | 0 | 1315 | 0 | 1368 | 1 | 1421 | 0 | 1474 | 0 | 1527 | 0 | 1580 | 0 | 1633 | 0 | 1686 | 1 | 1739 | 0 |
| 1210 | 0 | 1263 | 0 | 1316 | 0 | 1369 | 0 | 1422 | 0 | 1475 | 0 | 1528 | 1 | 1581 | 0 | 1634 | 0 | 1687 | 0 | 1740 | 0 |
| 1211 | 0 | 1264 | 0 | 1317 | 0 | 1370 | 0 | 1423 | 0 | 1476 | 0 | 1529 | 0 | 1582 | 0 | 1635 | 0 | 1688 | 0 | 1741 | 0 |
| 1212 | 0 | 1265 | 0 | 1318 | 0 | 1371 | 0 | 1424 | 0 | 1477 | 0 | 1530 | 0 | 1583 | 0 | 1636 | 0 | 1689 | 0 | 1742 | 0 |
| 1213 | 0 | 1266 | 0 | 1319 | 0 | 1372 | 0 | 1425 | 0 | 1478 | 0 | 1531 | 0 | 1584 | 0 | 1637 | 0 | 1690 | 0 | 1743 | 0 |
| 1214 | 0 | 1267 | 0 | 1320 | 0 | 1373 | 0 | 1426 | 0 | 1479 | 0 | 1532 | 0 | 1585 | 0 | 1638 | 0 | 1691 | 0 | 1744 | 0 |
| 1215 | 0 | 1268 | 0 | 1321 | 0 | 1374 | 0 | 1427 | 0 | 1480 | 0 | 1533 | 0 | 1586 | 0 | 1639 | 0 | 1692 | 0 | 1745 | 1 |
| 1216 | 0 | 1269 | 0 | 1322 | 0 | 1375 | 0 | 1428 | 0 | 1481 | 0 | 1534 | 0 | 1587 | 0 | 1640 | 0 | 1693 | 0 | 1746 | 0 |
| 1217 | 0 | 1270 | 0 | 1323 | 0 | 1376 | 0 | 1429 | 0 | 1482 | 0 | 1535 | 0 | 1588 | 0 | 1641 | 0 | 1694 | 0 | 1747 | 0 |
| 1218 | 0 | 1271 | 0 | 1324 | 0 | 1377 | 0 | 1430 | 1 | 1483 | 0 | 1536 | 0 | 1589 | 0 | 1642 | 0 | 1695 | 0 | 1748 | 0 |
| 1219 | 0 | 1272 | 0 | 1325 | 0 | 1378 | 0 | 1431 | 0 | 1484 | 0 | 1537 | 0 | 1590 | 0 | 1643 | 0 | 1696 | 0 | 1749 | 0 |

| ND | SD | ND | SD | ND | SD | ND | SD | ND | SD | ND | SD | ND | SD | ND | SD | ND | SD |
|---|---|---|---|---|---|---|---|---|---|---|---|---|---|---|---|---|---|
| 1750 | 0 | 1803 | 0 | 1856 | 0 | 1909 | 0 | 1962 | 0 | 2015 | 0 | 2068 | 0 | 2121 | 0 | 2174 | 0 |
| 1751 | 0 | 1804 | 0 | 1857 | 0 | 1910 | 0 | 1963 | 0 | 2016 | 0 | 2069 | 0 | 2122 | 0 | 2175 | 0 |
| 1752 | 0 | 1805 | 0 | 1858 | 0 | 1911 | 0 | 1964 | 0 | 2017 | 0 | 2070 | 0 | 2123 | 0 | 2176 | 0 |
| 1753 | 0 | 1806 | 0 | 1859 | 0 | 1912 | 0 | 1965 | 0 | 2018 | 0 | 2071 | 0 | 2124 | 0 | 2177 | 0 |
| 1754 | 0 | 1807 | 0 | 1860 | 0 | 1913 | 0 | 1966 | 0 | 2019 | 0 | 2072 | 0 | 2125 | 0 | 2178 | 0 |
| 1755 | 0 | 1808 | 0 | 1861 | 0 | 1914 | 0 | 1967 | 0 | 2020 | 0 | 2073 | 0 | 2126 | 0 | 2179 | 0 |
| 1756 | 0 | 1809 | 0 | 1862 | 0 | 1915 | 0 | 1968 | 0 | 2021 | 0 | 2074 | 0 | 2127 | 0 | 2180 | 1 |
| 1757 | 0 | 1810 | 0 | 1863 | 0 | 1916 | 0 | 1969 | 0 | 2022 | 0 | 2075 | 0 | 2128 | 0 | 2181 | 0 |
| 1758 | 0 | 1811 | 0 | 1864 | 0 | 1917 | 0 | 1970 | 0 | 2023 | 0 | 2076 | 0 | 2129 | 0 | 2182 | 0 |
| 1759 | 0 | 1812 | 0 | 1865 | 0 | 1918 | 0 | 1971 | 0 | 2024 | 0 | 2077 | 0 | 2130 | 0 | 2183 | 0 |
| 1760 | 0 | 1813 | 0 | 1866 | 1 | 1919 | 0 | 1972 | 0 | 2025 | 0 | 2078 | 0 | 2131 | 0 | 2184 | 0 |
| 1761 | 0 | 1814 | 0 | 1867 | 0 | 1920 | 0 | 1973 | 0 | 2026 | 0 | 2079 | 0 | 2132 | 1 | 2185 | 0 |
| 1762 | 0 | 1815 | 0 | 1868 | 0 | 1921 | 0 | 1974 | 0 | 2027 | 0 | 2080 | 0 | 2133 | 0 | 2186 | 0 |
| 1763 | 0 | 1816 | 0 | 1869 | 0 | 1922 | 0 | 1975 | 0 | 2028 | 0 | 2081 | 0 | 2134 | 0 | 2187 | 0 |
| 1764 | 0 | 1817 | 0 | 1870 | 0 | 1923 | 0 | 1976 | 0 | 2029 | 0 | 2082 | 0 | 2135 | 0 | 2188 | 0 |
| 1765 | 0 | 1818 | 0 | 1871 | 0 | 1924 | 0 | 1977 | 0 | 2030 | 0 | 2083 | 0 | 2136 | 0 | 2189 | 0 |
| 1766 | 0 | 1819 | 0 | 1872 | 0 | 1925 | 0 | 1978 | 0 | 2031 | 0 | 2084 | 0 | 2137 | 0 | 2190 | 0 |
| 1767 | 0 | 1820 | 0 | 1873 | 0 | 1926 | 0 | 1979 | 0 | 2032 | 0 | 2085 | 1 | 2138 | 0 | 2191 | 0 |
| 1768 | 0 | 1821 | 0 | 1874 | 0 | 1927 | 0 | 1980 | 0 | 2033 | 0 | 2086 | 0 | 2139 | 0 | 2192 | 0 |
| 1769 | 0 | 1822 | 0 | 1875 | 0 | 1928 | 0 | 1981 | 0 | 2034 | 0 | 2087 | 0 | 2140 | 0 | 2193 | 0 |
| 1770 | 0 | 1823 | 0 | 1876 | 0 | 1929 | 0 | 1982 | 0 | 2035 | 0 | 2088 | 0 | 2141 | 0 | 2194 | 0 |

APPENDIX-continued

| | | | | | | | | | | | | | | | |
|---|---|---|---|---|---|---|---|---|---|---|---|---|---|---|---|
| 1771 | 0 | 1824 | 0 | 1877 | 0 | 1930 | 0 | 1983 | 0 | 2036 | 0 | 2089 | 0 | 2142 | 0 | 2195 | 0 |
| 1772 | 0 | 1825 | 1 | 1878 | 0 | 1931 | 0 | 1984 | 0 | 2037 | 0 | 2090 | 0 | 2143 | 0 | 2196 | 0 |
| 1773 | 0 | 1826 | 0 | 1879 | 0 | 1932 | 0 | 1985 | 0 | 2038 | 0 | 2091 | 0 | 2144 | 0 | 2197 | 0 |
| 1774 | 0 | 1827 | 0 | 1880 | 0 | 1933 | 0 | 1986 | 0 | 2039 | 1 | 2092 | 0 | 2145 | 0 | 2198 | 0 |
| 1775 | 0 | 1828 | 0 | 1881 | 0 | 1934 | 0 | 1987 | 0 | 2040 | 0 | 2093 | 0 | 2146 | 0 | 2199 | 0 |
| 1776 | 0 | 1829 | 0 | 1882 | 0 | 1935 | 0 | 1988 | 0 | 2041 | 0 | 2094 | 0 | 2147 | 0 | 2200 | 0 |
| 1777 | 0 | 1830 | 0 | 1883 | 0 | 1936 | 0 | 1989 | 0 | 2042 | 0 | 2095 | 0 | 2148 | 0 | 2201 | 0 |
| 1778 | 0 | 1831 | 0 | 1884 | 0 | 1937 | 0 | 1990 | 0 | 2043 | 0 | 2096 | 0 | 2149 | 0 | 2202 | 0 |
| 1779 | 0 | 1832 | 0 | 1885 | 0 | 1938 | 0 | 1991 | 0 | 2044 | 0 | 2097 | 0 | 2150 | 0 | 2203 | 0 |
| 1780 | 0 | 1833 | 0 | 1886 | 0 | 1939 | 0 | 1992 | 0 | 2045 | 0 | 2098 | 0 | 2151 | 0 | 2204 | 0 |
| 1781 | 0 | 1834 | 0 | 1887 | 0 | 1940 | 0 | 1993 | 0 | 2046 | 0 | 2099 | 0 | 2152 | 0 | 2205 | 0 |
| 1782 | 0 | 1835 | 0 | 1888 | 0 | 1941 | 0 | 1994 | 1 | 2047 | 0 | 2100 | 0 | 2153 | 0 | 2206 | 0 |
| 1783 | 0 | 1836 | 0 | 1889 | 0 | 1942 | 0 | 1995 | 0 | 2048 | 0 | 2101 | 0 | 2154 | 0 | 2207 | 0 |
| 1784 | 0 | 1837 | 0 | 1890 | 0 | 1943 | 0 | 1996 | 0 | 2049 | 0 | 2102 | 0 | 2155 | 0 | 2208 | 0 |
| 1785 | 1 | 1838 | 0 | 1891 | 0 | 1944 | 0 | 1997 | 0 | 2050 | 0 | 2103 | 0 | 2156 | 0 | 2209 | 0 |
| 1786 | 0 | 1839 | 0 | 1892 | 0 | 1945 | 0 | 1998 | 0 | 2051 | 0 | 2104 | 0 | 2157 | 0 | 2210 | 0 |
| 1787 | 0 | 1840 | 0 | 1893 | 0 | 1946 | 0 | 1999 | 0 | 2052 | 0 | 2105 | 0 | 2158 | 0 | 2211 | 0 |
| 1788 | 0 | 1841 | 0 | 1894 | 0 | 1947 | 0 | 2000 | 0 | 2053 | 0 | 2106 | 0 | 2159 | 0 | 2212 | 0 |
| 1789 | 0 | 1842 | 0 | 1895 | 0 | 1948 | 0 | 2001 | 0 | 2054 | 0 | 2107 | 0 | 2160 | 0 | 2213 | 0 |
| 1790 | 0 | 1843 | 0 | 1896 | 0 | 1949 | 0 | 2002 | 0 | 2055 | 0 | 2108 | 0 | 2161 | 0 | 2214 | 0 |
| 1791 | 0 | 1844 | 0 | 1897 | 0 | 1950 | 0 | 2003 | 0 | 2056 | 0 | 2109 | 0 | 2162 | 0 | 2215 | 0 |
| 1792 | 0 | 1845 | 0 | 1898 | 0 | 1951 | 1 | 2004 | 0 | 2057 | 0 | 2110 | 0 | 2163 | 0 | 2216 | 0 |
| 1793 | 0 | 1846 | 0 | 1899 | 0 | 1952 | 0 | 2005 | 0 | 2058 | 0 | 2111 | 0 | 2164 | 0 | 2217 | 0 |
| 1794 | 0 | 1847 | 0 | 1900 | 0 | 1953 | 0 | 2006 | 0 | 2059 | 0 | 2112 | 0 | 2165 | 0 | 2218 | 0 |
| 1795 | 0 | 1848 | 0 | 1901 | 0 | 1954 | 0 | 2007 | 0 | 2060 | 0 | 2113 | 0 | 2166 | 0 | 2219 | 0 |
| 1796 | 0 | 1849 | 0 | 1902 | 0 | 1955 | 0 | 2008 | 0 | 2061 | 0 | 2114 | 0 | 2167 | 0 | 2220 | 0 |
| 1797 | 0 | 1850 | 0 | 1903 | 0 | 1956 | 0 | 2009 | 0 | 2062 | 0 | 2115 | 0 | 2168 | 0 | 2221 | 0 |
| 1798 | 0 | 1851 | 0 | 1904 | 0 | 1957 | 0 | 2010 | 0 | 2063 | 0 | 2116 | 0 | 2169 | 0 | 2222 | 0 |
| 1799 | 0 | 1852 | 0 | 1905 | 0 | 1958 | 0 | 2011 | 0 | 2064 | 0 | 2117 | 0 | 2170 | 0 | 2223 | 0 |
| 1800 | 0 | 1853 | 0 | 1906 | 0 | 1959 | 0 | 2012 | 0 | 2065 | 0 | 2118 | 0 | 2171 | 0 | 2224 | 0 |
| 1801 | 0 | 1854 | 0 | 1907 | 0 | 1960 | 0 | 2013 | 0 | 2066 | 0 | 2119 | 0 | 2172 | 0 | 2225 | 0 |
| 1802 | 0 | 1855 | 0 | 1908 | 1 | 1961 | 0 | 2014 | 0 | 2067 | 0 | 2120 | 0 | 2173 | 0 | 2226 | 0 |

What is claimed is:

1. A method comprising an act of:
a) protecting a data set that comprises a plurality of data bits with a parity set that comprises a plurality of parity bits, wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a first degree distribution that is substantially similar to a second degree distribution in which $N_j$ defines a number of parity points of degree j, wherein $N_j$ is equal to zero for values of j from 1 through j* plus 1, and wherein $N_j$ satisfies the following formula for values of j from j* plus 2 to imax;

$$\sum_{j=j^*+2}^{imax} N_j = \text{Int}\left[ s \sum_{j=j^*+2}^{imax} \left( \frac{pk}{j-j^*-1} - \frac{pk+1-A\sqrt{pk}}{j-j^*} \right) \right]$$

wherein;
p is a fraction of loss being protected against;
k is a number of data points in the bipartite graph;
imax defines a maximum possible degree for the parity points in the bipartite graph;
s is a scaling factor;
j* defines a degree of a lowest non-zero degree parity point minus two; and
A is a variable.

2. The method of claim 1, wherein the act (a) comprises an act of encoding the parity set.

3. The method of claim 2, further comprising an act of transmitting the data set and the parity set to a receiver.

4. The method of claim 1, wherein the act (a) comprises an act of recovering from an erasure of at least one of the data bits in the data set by decoding the at least one of the data bits using the parity set and the data set.

5. The method of claim 1, wherein the (a) comprises an act of recovering from an error in at least one of the data bits in the data set by decoding the at least one of the data bits using the parity set and the data set.

6. The method of claim 1, wherein the bipartite graph has a number of edges, wherein $M_j$ defines a number of parity points of degree j for the first degree distribution, and wherein a maximum value of $|M_j - N_j|$ for all values of j is less than 10% of the number of data bits in the data set.

7. The method of claim 1, wherein the data set is stored in at least one data storage system, and wherein the method further comprises an act of storing the parity set in the at least one data storage system to protect against a corruption of the data set in the at least one data storage system.

8. The method of claim 1, wherein the act (a) comprises an act of employing a parity set wherein the first degree distribution is identical to the second degree distribution.

9. At least one computer readable medium encoded with instructions that, when executed, perform a method comprising an act of:
(a) protecting a data set that comprises a plurality of data bits with a parity set that comprises a plurality of parity bits, wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a first degree distribution that is substantially similar to a second degree distribution in which $N_j$ defines a number of parity points of degree j, wherein $N_j$ is equal to zero for values of j from 1 through j* plus 1, and wherein $N_j$ satisfies the following formula for values of j from j* plus 2 to imax;

$$\sum_{j=j^*+2}^{imax} N_j = \text{Int}\left[s \sum_{j=j^*+2}^{imax} \left(\frac{pk}{j-j^*-1} - \frac{pk+1-A\sqrt{pk}}{j-j^*}\right)\right]$$

wherein;
p is a fraction of loss being protected against;
k is a number of data points in the bipartite graph;
imax defines a maximum possible degree for the parity points in the bipartite graph;
s is a scaling factor;
j* defines a degree of a lowest non-zero degree parity point minus two; and
A is a variable.

10. The computer readable medium of claim 9, wherein the act (a) comprises an act of encoding the parity set.

11. The computer readable medium of claim 10, wherein the method further comprises an act of transmitting the data set and the parity set to a receiver.

12. The computer readable medium of claim 9 wherein the act (a) comprises an act of recovering from an erasure of at least one of the data bits in the data set by decoding the at least one of the data bits using the parity set and the data set.

13. The computer readable medium of claim 9, wherein the act (a) comprises an act of recovering from an error in at least one of the data bits in the data set by decoding the at least one of the data bits using the parity set and the data set.

14. The computer readable medium of claim 9, wherein the bipartite graph has a number of edges, wherein $M_j$ defines a number of parity points of degree j for the first degree distribution, and wherein a maximum value of $|M_j-N_j|$ for all values of j is less than 10% of the number of data bits in the data set.

15. The computer readable medium of claim 9, wherein the data set is stored in at least one data storage system, and wherein the method further comprises an act of storing the parity set in the at least one data storage system to protect against a corruption of the data set in the at least one data storage system.

16. The computer readable medium of claim 9, wherein the act (a) comprises an act of employing a parity set wherein the first degree distribution is identical to the second degree distribution.

17. An apparatus comprising:
at least one of an encoder to encode a parity set for a data set and a decoder to decode at least a portion of the data set using the parity set;
wherein the data set comprises a plurality of data bits and the parity set comprises a plurality of parity bits, and
wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a first degree distribution that is substantially similar to a second degree distribution in which $N_j$ defines a number of parity points of degree j, wherein $N_j$ is equal to zero for values of j from 1 through j* plus 1, and wherein $N_j$ satisfies the following formula for values of j from j* plus 2 to imax;

$$\sum_{j=j^*+2}^{imax} N_j = \text{Int}\left[s \sum_{j=j^*+2}^{imax} \left(\frac{pk}{j-j^*-1} - \frac{pk+1-A\sqrt{pk}}{j-j^*}\right)\right]$$

wherein;
p is a fraction of loss being protected against;
k is a number of data points in the bipartite graph;
imax defines a maximum possible degree for the parity points in the bipartite graph;
s is a scaling factor;
j* defines a degree of a lowest non-zero degree parity point minus two; and
A is a variable.

18. The apparatus of claim 17, wherein the at least one of an encoder and a decoder comprises the encoder.

19. The apparatus of claim 18, wherein the apparatus further comprises a transmitter that transmits the data set and the parity set to a receiver.

20. The apparatus of claim 17, wherein the at least one of an encoder and a decoder comprises the decoder, and wherein the decoder is adapted to recover from an erasure of at least one of the data bits in the data set by decoding the at least one of the data bits using the parity set and the data set.

21. The apparatus of claim 17, wherein the at least one of an encoder and a decoder comprises the decoder, and wherein the decoder is adapted to recover from an error in at least one of the data bits in the data set by decoding the at least one of the data bits using the parity set and the data set.

22. The apparatus of claim 17, wherein the bipartite graph has a number of edges, wherein $M_j$ defines a number of parity points of degree j for the first degree distribution, and wherein a maximum value of $|M_j-N_j|$ for all values of j is less than 10% of the number of data bits in the data set.

23. The apparatus of claim 17, in combination with at least one data storage system that stores the data set and the parity set to protect against a corruption of the data set in the at least one data storage system.

24. The apparatus of claim 17, wherein the first degree distribution is identical to the second degree distribution.

25. The apparatus of claim 17, wherein the encoder comprises means for encoding the parity set and the decoder comprises means for decoding the at least a portion of the data set.

26. A method comprising an act of:
(a) protecting a data set that comprises a plurality of data bits with a parity set that comprises a plurality of parity bits, wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a degree distribution that includes no parity point having a degree less than three.

27. The method of claim 26, wherein the act (a) comprises an act of encoding the parity set.

28. The method of claim 27, further comprising an act of transmitting the data set and the parity set to a receiver.

29. The method of claim 26, wherein the act (a) comprises an act of recovering from an erasure of at least one of the data bits in the data set by decoding the at least one of the data bits using the parity set and the data set.

30. The method of claim 26, wherein the act (a) comprises an act of recovering from an error in at least one of the data bits in the data set by decoding the at least one of the data bits using the parity set and the data set.

31. The method of claim 26, wherein the data set is stored in at least one data storage system, and wherein the method further comprises an act of storing the parity set in the at least one data storage system to protect against a corruption of the data set in the at least one data storage system.

32. The method of claim 26, wherein the act (a) comprises an act of employing a parity set defined by a bipartite graph having a degree distribution that includes no parity point having a degree less than five.

33. The method of claim 26, wherein the act (a) comprises an act of employing a parity set defined by a bipartite graph having a degree distribution that includes no parity point having a degree less than seven.

34. The method of claim 26, wherein the act (a) comprises an act of employing a parity set defined by a bipartite graph having a degree distribution that includes no parity point having a degree less than ten.

35. At least one computer readable medium encoded with instructions that, when executed, perform a method comprising an act of:
  (a) protecting a data set that comprises a plurality of data bits with a parity set that comprises a plurality of parity bits, wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a degree distribution that includes no parity point having a degree less than three.

36. The computer readable medium of claim 35, wherein the act (a) comprises an act of encoding the parity set.

37. The computer readable medium of claim 36, wherein the method further comprises an act of transmitting the data set and the parity set to a receiver.

38. The computer readable medium of claim 35, wherein the act (a) comprises an act of recovering from an erasure of at least one of the data bits in the data set by decoding the at least one of the data bits using the parity set and the data set.

39. The computer readable medium of claim 35, wherein the act (a) comprises an act of recovering from an error in at least one of the data bits in the data set by decoding the at least one of the data bits using the parity set and the data set.

40. The computer readable medium of claim 35, wherein the act (a) comprises an act of employing a parity set defined by a bipartite graph having a degree distribution that includes no parity point having a degree less than five.

41. The computer readable medium of claim 35, wherein the act (a) comprises an act of employing a parity set defined by a bipartite graph having a degree distribution that includes no parity point having a degree less than seven.

42. The computer readable medium of claim 35, wherein the act (a) comprises an act of employing a parity set defined by a bipartite graph having a degree distribution that includes no parity point having a degree less than ten.

43. The computer readable medium of claim 35, wherein the data set is stored in at least one data storage system, and wherein the method further comprises an act of storing the parity set in the at least one data storage system to protect against a corruption of the data set in the at least one data storage system.

44. An apparatus comprising:
  at least one of an encoder to encode a parity set for a data set and a decoder to decode at least a portion of the data set using the parity set;
  wherein the data set comprises a plurality of data bits and the parity set comprises a plurality of parity bits, and
  wherein the parity set and the data set have a relationship defined by a bipartite graph comprising a plurality of data points and a plurality of parity points, wherein each data point represents at least one of the plurality of data bits and each parity point represents at least one of the plurality of parity bits, wherein each one of the plurality of parity points has a degree that defines a number of data points to which the one of the plurality of parity points corresponds, the plurality of parity points being selected to have a degree distribution that includes no parity point having a degree less than three.

45. The apparatus of claim 44, wherein the at least one of an encoder and a decoder comprises the encoder.

46. The apparatus of claim 45, wherein the apparatus further comprises a transmitter that transmits the data set and the parity set to a receiver.

47. The apparatus of claim 44, wherein the at least one of an encoder and a decoder comprises the decoder, and wherein the decoder is adapted to recover from an erasure of at least one of the data bits in the data set by decoding the at least one of the data bits using the parity set and the data set.

48. The apparatus of claim 44, wherein the at least one of an encoder and a decoder comprises the decoder, and wherein the decoder is adapted to recover from an error in at least one of the data bits in the data set by decoding the at least one of the data bits using the parity set and the data set.

49. The apparatus of claim 44, wherein the bipartite graph has a degree distribution that includes no parity point having a degree less than five.

50. The apparatus of claim 44, wherein the bipartite graph has a degree distribution that includes no parity point having a degree less than seven.

51. The apparatus of claim 44, wherein the bipartite graph has a degree distribution that includes no parity point having a degree less than ten.

52. The apparatus of claim 44, in combination with at least one data storage system that stores the data set and the parity set to protect against a corruption of the data set in the at least one data storage system.

53. The apparatus of claim 44, wherein the encoder comprises means for encoding the parity set and the decoder comprises means for decoding the at least a portion of the data set.

* * * * *